(12) United States Patent
Stecher et al.

(10) Patent No.: US 8,093,677 B2
(45) Date of Patent: Jan. 10, 2012

(54) SEMICONDUCTOR DEVICE AND MANUFACTURING METHOD

(75) Inventors: Matthias Stecher, Munich (DE);
Hans-Joachim Schulze, Taufkirchen (DE); Thomas Neidhart, Klagenfurt (DE)

(73) Assignee: Infineon Technologies Austria AG, Villach (AT)

( * ) Notice: Subject to any disclaimer, the term of this patent is extended or adjusted under 35 U.S.C. 154(b) by 244 days.

(21) Appl. No.: 12/425,988

(22) Filed: Apr. 17, 2009

(65) Prior Publication Data
US 2010/0264508 A1   Oct. 21, 2010

(51) Int. Cl.
*H01L 21/70* (2006.01)
(52) U.S. Cl. .................... 257/508; 257/520
(58) Field of Classification Search .............. 257/508, 257/509, 520, 347
See application file for complete search history.

(56) References Cited

U.S. PATENT DOCUMENTS

| | | | |
|---|---|---|---|
| 5,889,293 A | 3/1999 | Hirabayashi | |
| 5,889,314 A | 3/1999 | Hirabayashi | |
| 6,214,750 B1 | 4/2001 | Liao | |
| 2010/0264508 A1* | 10/2010 | Stecher et al. | 257/503 |

FOREIGN PATENT DOCUMENTS
DE   102006031538 A1   1/2008

OTHER PUBLICATIONS

"Key Features of a Smart Power Technology for Automotive Applications," J. Busch, et al., Infineon Technologies AG, SPT-Conference Proceedings CIPS, 2002.

* cited by examiner

*Primary Examiner* — Mark Prenty
(74) *Attorney, Agent, or Firm* — Dicke, Billig & Czaja, PLLC

(57) ABSTRACT

A semiconductor device and manufacturing method is disclosed. One embodiment provides a common substrate of a first conductivity type and at least two wells of a second conductivity type. A buried high resistivity region and at least an insulating structure is provided insulating the first well from the second well. The insulating structure extends through the buried high resistivity region and includes a conductive plug in Ohmic contact with the first semiconductor region. A method for forming an integrated semiconductor device is also provided.

17 Claims, 22 Drawing Sheets

SEMICONDUCTOR DEVICE AND MANUFACTURING METHOD

BACKGROUND

This specification refers to integrated semiconductor devices, in one embodiment to smart power integrated semiconductor devices, having a protecting structure between different parts thereof and a manufacturing method therefor.

Many functions of modern devices in automotive, consumer and industrial applications such as driving a motor or an electric machine are controlled by Electronic Control Units (ECUs). In automobiles, for example, igniting an airbag, switching the valves of an ABS on and off, and injecting fuel into the cylinders of the motor are activated and regulated, respectively, by different decentralized ECUs. Even many home appliances like a washing machine and a dish washer are controlled by ECUs. Typically, an ECU includes analog, digital and power modules and at least one microcontroller (µC). To minimize cost, size and weight of the electronics, the digital and analog circuits of an ECU are typically monolithically integrated on a common substrate as a single integrated circuit (IC). Depending on the application, this can e.g., be achieved in a HV-CMOS technology or in a smart power technology. While HV-CMOS technology combines high-voltage MOS (HV-MOS) and CMOS transistors, smart power technology offers in addition bipolar transistors for high precision analog functions, and DMOS transistors to drive loads up to several amperes.

Electrostatic discharge (ESD) pulses occurring during assembly and energetic electric pulses during operation, e.g., due to switching of actuators, should not lead to malfunction or destruction of an ECU. Even simple actuators such as a contact bouncing relay generate repeating over-voltage pulses with fast rise and fall times. With inductive loads, negative voltages may occur during reverse currents as well. Energetic electric pulses typically last a few nanoseconds up to several milliseconds. Many of these pulses have been standardized in the ISO-7637. Some of these pulses which are in the range of nanoseconds are similar to ESD pulses. Even if the pulses do not destroy the other modules, such pulses may induce noise into the substrate ("substrate potential fluctuations") and hence function as a noise source for the other modules. This may result in a shift of the operating point or a complete intermittent fault of these modules during operation. For example, negative voltage pulses injected into a motor driver module, in particular for drive loads in the ampere range, may provide a significant noise source for an analog measuring module and/or a logic module. To ensure high reliability it is, therefore, often desirable to efficiently insulate or decouple the different modules of the IC from each other. In doing so, any cross-talk between the modules is eliminated or at least reduced. Consequently, a pulse injected into one module of the IC is mainly dissipated or absorbed within the respective module. Thereby, the other modules can be protected. This is particularly important in automotive electronics for which the reliability requirements are one or two orders of magnitude higher above those of standard technologies. Insulating the modules of an IC from each other reduces, in addition, the cross-talk between the different modules over the common substrate which results from the operation of the modules themselves. Typically, this cross-talk becomes more important with increasing level of integration. Furthermore, insulating the modules on chip level reduces costs as the protection elements are integrated into the ICs.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
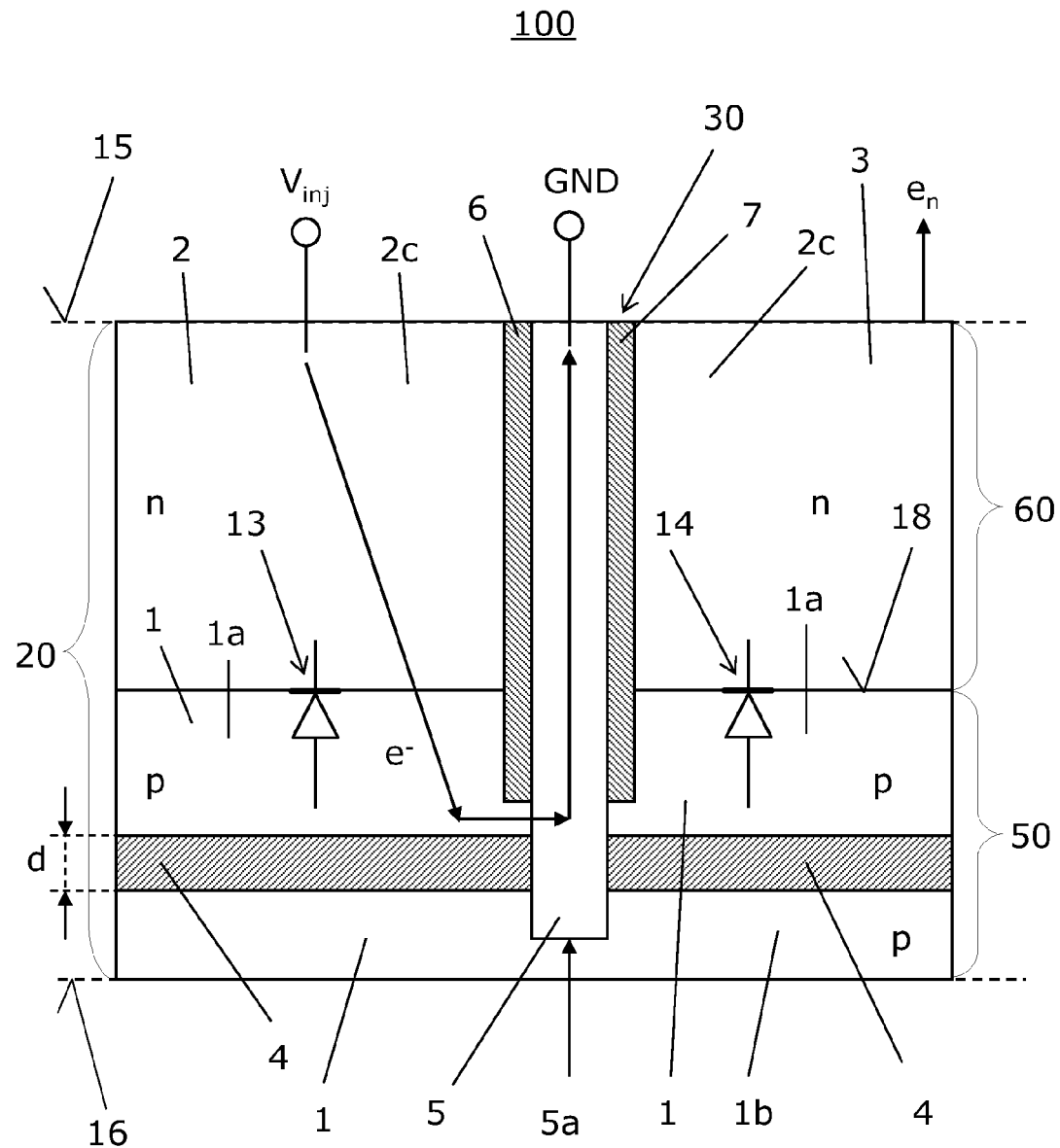
FIG. 1 illustrates a vertical cross-section of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The term "horizontal" as used in this specification intends to describe an orientation parallel to a first or main surface of a semiconductor substrate or body. This can be for instance the surface of a wafer or a die.

The term "vertical" as used in this specification intends to describe an orientation which is arranged perpendicular to the first surface, i.e., parallel to the normal direction of the first surface, of the semiconductor substrate or body.

In this specification, p-doped is referred to as first conductivity type while n-doped is referred to as second conductivity type. It goes without saying that the semiconductor devices can be formed with opposite doping relations so that the first conductivity type can be n-doped and the second conductivity type can be p-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+ regions can have different absolute doping concentrations. The same applies, for example, to an n− and a p+ region.

Specific embodiments described in this specification pertain to, without being limited thereto, integrated semiconductor devices, in one embodiment to power integrated semiconductor devices. The terms "smart power integrated circuit" and "smart power integrated device" as used in this specification intends to describe a semiconductor device that combines low voltage devices or circuitry, mostly CMOS, with high voltage and or high current switching devices on a single chip. In other words, smart power integrated circuits or devices are intended for high current, typically in the Ampere range, and/or high voltages, typically above 500 V, and combine power semiconductor technology with low voltage, high density circuitry, i.e., IC technology such as Large Scale Integration (LSI) technology or even Very Large Scale Integration (VLSI) technology, on a single chip. Examples of smart power integrated circuits include, without being limited thereto, motor drivers for various types, switch drivers, off line circuits, bridge driver and complete power switching regulators for computer peripheral, industrial and automotive applications. Furthermore, several power drivers, e.g., a solenoid driver and a motor driver, may be integrated on a single chip in a smart power IC. Smart power ICs are typically combined with a micro-controller in Electronic Control Units.

According to one embodiment, a semiconductor device is provided. The semiconductor device includes a first semiconductor region of a first conductivity type and at least a first and a second zone of a second conductivity type. The first and the second zone form respective pn-junctions with the first semiconductor region. The semiconductor device further includes a buried high resistivity region and at least an insulating structure which insulates the first zone from the second zone. The insulating structure includes a conductive plug which extends through the buried high resistivity region and is in Ohmic contact with the first semiconductor region.

FIG. 1 illustrates one embodiment of a semiconductor device 100 in a section of a vertical cross-section. The semiconductor device 100 includes a semiconductor body 20 having a first or main surface 15 and a second surface 16 arranged opposite to the first surface 15. The normal direction $e_n$ of the first surface 15 is substantially parallel or parallel to, i.e., defines, the vertical direction. The semiconductor body 20 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide ($Si_xC_{1-x}$) and SiGe heterojunction semiconductor material. For power semiconductor applications currently mainly Si, SiC and GaN materials are used.

The semiconductor body 20 can be a single bulk mono-crystalline material. It is also possible, that the semiconductor body 20 includes a bulk mono-crystalline material 50 and at least one epitaxial layer 60 formed thereon. Using epitaxial layers 60 provides more freedom in tailoring the background doping of the material since the doping concentration can be adjusted during deposition of the epitaxial layer or layers.

Typically, the semiconductor body 20 includes a single bulk mono-crystalline body 50 of a first conductivity type (p-type) and one or more single-crystalline layers 60 of a second conductivity type (n-type). The mono-crystalline body 50 can form a first semiconductor region 1 and a common substrate 1, respectively, of the first conductivity type, and the one or more layers 60 can form a second semiconductor region 2c of the second conductivity type. Between the first and the second semiconductor region a pn-junction is formed. Typically, the pn-junction has an interface 18 which extends in parallel to the first surface 15. The manufacturing of the semiconductor body 20 can include an epitaxial deposition process. If desired, the manufacturing can include separate epitaxial deposition processes with different dopants of varying concentration or with the same dopant but with varying concentration to form the respective functional regions. It would also be possible to form the second semiconductor region 2c by implantation in combination with a subsequent annealing process.

According to one embodiment, a high Ohmic or highly resistive region 4 is embedded within the first semiconductor region 1. In the context of the present specification, the terms "high Ohmic region", "highly resistive region", "highly resistive layer", and "high Ohmic layer" intend to describe that this region or layer provides an dielectric insulation, or an electric connection and current path, respectively, of high resistivity and with a symmetric current-voltage (I-V) curve, between two other regions, portion or parts of a semiconductor device. The resistivity of the high resistivity region 4 is typically at least two orders of magnitude higher than the resistivity of the adjoining semiconductor regions, e.g., the first semiconductor region 1. Typically, the resistivity of the high resistivity region 4 is even at least two orders of magnitude higher than the intrinsic resistivity of the monocrystalline semiconductor material which adjoins the high resistivity region 4. In one or more embodiments, the high Ohmic layer may also be insulating. In one or more embodiments, the high resistivity layer or region provides an Ohmic electric connection and Ohmic current path, respectively, of high resistivity between two other regions, portion or parts of the semiconductor device.

Typically, the high resistivity region 4 is formed by a buried layer 4 which is essentially parallel to the first surface 15. The high resistivity layer 4 of FIG. 1 is completely embedded within and divides the first semiconductor region 1 into a first portion 1a above the high resistivity region 4 and a second portion 1b which is arranged between the second surface 16 and the high resistivity region 4.

In one or more embodiments, the buried layer 4 includes lattice defects which may be produced by implanting of protons. Depending on concentration of lattice defects, the resistivity of the buried layer 4 increases by up to two to four orders of magnitude.

In one embodiment, the high resistivity region 4 includes a dielectric, i.e., insulating, buried layer 4. Such a layer 4 may be formed by implanting of ions in a sufficiently high, i.e., stoichiometric, concentration to form an insulator. For example, nitrogen and/or oxygen ions may be implanted into silicon to form a layer of $Si_3N_4$, $SiO_2$ or $SiO_xN_y$, which is embedded within the first semiconductor region 1. In this event, the resistivity of the buried layer 4 and the high resistivity region 4, respectively, is typically many orders of magnitude higher than the resistivity of the surrounding first semiconductor region 1.

In one or more embodiments, the semiconductor body 20 includes a silicon on insulator (SOI) substrate or wafer. In this event, the high resistivity region 4 is formed by a buried oxide (BOX) layer of the silicon on insulator substrate or wafer. Typically, the buried oxide layer includes an insulating dielectric material such as $Si_3N_4$, $SiO_2$ and $SiO_xN_y$. The buried oxide layer may also include an $Al_2O_3$ layer or a diamond layer. The SOI substrate typically forms the first semiconductor region 1 having an embedded high resistivity region 4. One or more epitaxially deposited layers 60 of a second conductivity type (n-type) may form the second semiconductor region. In one embodiment, the second semiconductor region may be formed by implantation of dopants into the SOI substrate or wafer.

The semiconductor device 100 of FIG. 1 further includes a deep vertical trench 5a which extends from the first surface 15, through the one or more layers 60, the high resistivity region 4 into the second portion 1b of the first semiconductor region 1. The trench 5a includes or is filled with a conductive plug 5 for connecting the first portion 1a and the second portion 1b with a ground potential GND. The conductive plug 5 is typically made of a metal such as Al, Ti, W and Cu but may also be made of a material with metallic or near metallic properties with respect to electric conductivity such as highly doped n-type or p-type poly-Si, TiN, carbon or an electrically conductive silicide such as $WSi_2$. In the context of the present specification, the terms "in Ohmic contact", "in electric contact", "in contact" and "electrically connected" intend to describe that there is an Ohmic electric connection or Ohmic current path between two regions, portion or parts of a semiconductor devices, in one embodiment a connection of low Ohmic resistance, even if no voltages are applied to the semiconductor device.

Furthermore, the lateral walls of the trench 5a are, in an upper portion of the trench 5a and in the cross-section illustrated, covered with a first insulating region 6 and a second insulating region 7 such that the conductive plug 5 is insulated from the second semiconductor region 2c. Typically, the first insulating region 6 and the second insulating region 7 are formed as layers of a dielectric material such as $Si_3N_4$, $SiO_2$, and $SiO_xN_y$ to ensure a high resistivity. In doing so, the conductive plug 5 and the insulating regions 6 and 7 form an insulating structure 30 which insulates a first zone 2 or first well 2 from a second zone 3 or second well 3 of the second semiconductor region 2c. As illustrated in FIG. 1, the first and second insulating regions 6, 7 are spaced apart from the high resistivity region 4 to allow electrical contact between the conducting plug 5 and the first portion 1a. The conductive plug 5 extends through the high resistivity region 4 to electrically connect the second portion 1b with the first portion 1a.

In one embodiment, the semiconductor device 100 includes a first p-type semiconductor region 1 or a common p-type substrate 1 having a high resistivity layer 4 between a first portion 1a and a second portion 1b of the common substrate 1, and two n-type wells 2 and 3 each of which forms a respective pn-junction or diode structures 13 and 14 with the first portion 1a. The two n-type wells 2 and 3 extend to a first surface 15 and are laterally insulated from each other by an insulating structure 30 having additionally a conductive plug 5 which contacts both portions 1a and 1b of the common substrate 1. Accordingly, there is, within the semiconductor body 20, no Ohmic current path or Ohmic connection between the first well 2 and second well 3. Furthermore, an electron current (e⁻) which is injected from one well, e.g., the first well 2, into the common substrate 1 as illustrated in FIG. 1 by the arrow, can typically be discharged through the conductive plug 5.

Typically, the first well 2 and the second well 3 include at least one semiconductor device such as a diode, a transistor or even a complete circuitry. For example, the first well 2 includes a power transistor to which an inductive load is connected and the second well includes a CMOS logical circuitry. If the inductive load or an ESD pulse causes a high enough negative voltage $V_{inj}$ in the first well 2 during an operating cycle, the diode 13 is switched in forward mode, electrons e are injected into the first portion 1a and drained off through the conductive plug 5 to a ground connection (GND). In doing so, the logical circuitry of the second well 3 is protected against changes of the electric potential of the common substrate 1. Depending on the inductive load, large currents up to several amperes may be injected. In a device without the conductive plug 5 this could result in significant changes or fluctuations of the electrical potential of the common substrate 1. Further, in a structure without the buried high resistivity layer or region 4, a part of the injected current could flow to the second well 3 through flow paths in the second portion 1b, i.e., below the conductive plug 5, of the common substrate 1. This, in turn, could result in disturbing or even destroying the circuitry of the second well 3. In other words, the buried high resistivity layer or region 4 and the insulating structure 30 together with the conductive plug 5 form a protecting structure which insulates the first well 2 from second well 3 and protects the second well 3 against external charge injections into the first well 2. Due to the symmetric setup, the first well 2 is also protected against external charge injections into the second well 3.

Since the first portion 1a and the second portion 1b are connected via the conductive plug 5 to the same ground potential (GND), the vertical thickness of the buried high resistivity layer 4 can be comparatively small. Even high negative or positive voltages $V_{inj}$, e.g., −60 V or −80 V, applied to the first well 2 (or second well 3) will not cause electric breakdown of a thin, e.g., less than 5 nm or 10 nm thick, buried high resistivity layer 4, since the conductive plug 5 short-circuits the first portion 1a with the second portion 1b and prevents the build-up of a high voltage difference between these portions. An electric breakdown would, however, be likely to happen in a semiconductor device without the conductive plug 5 or with only one of the first and second portions 1a and 1b being connected to ground. In those devices a $SiO_2$ layer 4 is thicker than about 500 nm in order to withstand a voltage drop of 60 V. Therefore, the two portions 1a and 1b of the common substrate 1 are typically connected by the conductive plug 5 to the same potential. In doing so, the semiconductor device 100 can be realized with a much thinner insulation to the common substrate 1 compared to devices in which the wells are completely, i.e., dielectrically, insulated from each other and the common substrate 1. Accordingly, the vertical thickness d of the buried high resistivity layer 4 may be lower than 100 nm, even if the semiconductor device 100 is a power semiconductor device. In some embodiments, the vertical thickness d is smaller than 50 nm, smaller than 20 nm, smaller than 10 nm or even smaller than 1 nm. Even a monolayer of atoms or molecules of a dielectric material such as $SiO_2$ or $SiO_xN_y$ may be used as long as a high enough resistance between the first portion 1a and second portion 1b through the high resistivity layer 4 is ensured. Typically, the resistivity times vertical thickness d of the buried high resistivity layer 4 is larger than about 1 Ohm*$m^2$, more typically larger than 100 Ohm*$m^2$.

In one embodiment for power semiconductor devices, a thin high resistivity layer 4 is desirable in order to ensure a sufficient cooling of the semiconductor device 100 via the second surface 16. A thin high resistivity layer 4 ensures a high enough heat flow from the wells 2 and 3, respectively, through the common substrate 1 and the buried high resistivity layer 4 to the second surface 16. Typically, the buried high resistivity layer 4 has a heat transfer coefficient which is larger than about $10^8$ W/(K*$m^2$). This corresponds to a buried high resistivity layer 4 made of $SiO_2$ which is less than about 15 nm thick. If the buried high resistivity layer 4 is made of diamond, sapphire ($Al_2O_3$), SiC or the semiconductor material of the common substrate 1 having lattice defects in a high enough concentration to ensure a low enough electric conductivity, the vertical thickness d may also be chosen larger, e.g., up to a few μm. This is due to the higher thermal conductivity of these materials compared to $SiO_2$ or $SiO_xN_y$.

In one embodiment, the protecting structure having a buried high resistivity layer or region 4 and an insulating structure 30 having a conductive plug 5 facilitates a semiconductor device 100 with both good thermal properties and a high robustness or ruggness against ESD pulses and energetic electric pulses during operation, i.e., a high reverse current stability. It goes without saying that such a protecting structure may also be used to protect more than two wells 2 and 3. Furthermore, comparatively cheap SOI wafers with thin buried oxide layers may be used to produce complex smart power integrated devices or circuits, respectively.

Figure 2:
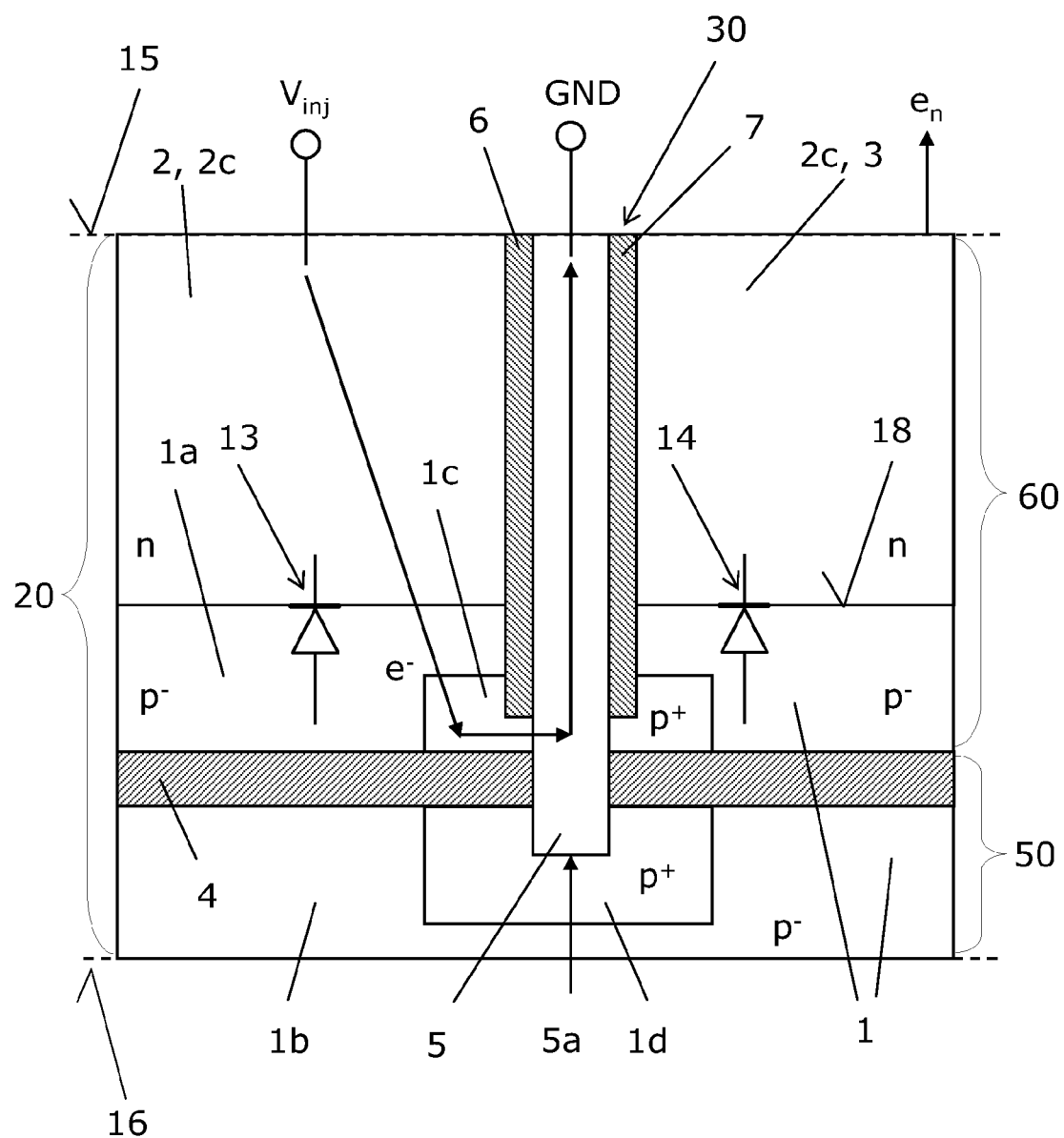
FIG. 2 illustrates a vertical cross-section of a semiconductor device according to one embodiment.

With respect to FIG. 2 another embodiment will be explained. The semiconductor device 100 of FIG. 2 is similar to the semiconductor device of FIG. 1. In addition, highly doped p-type contact regions 1c and 1d are embedded in the first portion 1a and second portion 1b, respectively, of the common substrate 1. As indicated by the symbols "$p^+$" and "p", the contact regions 1c and 1d have a higher doping concentration than the respective portion in which they are embedded. The contact regions 1c and 1d are in contact with the conductive plug 5 and provide a better Ohmic connection between the plug 5 and the respective portion 1a and 1b of the first semiconductor region 1. It is, however, also possible that only one of the portions 1a and 1b is contacted via a respective contact region 1c and 1d, respectively, with the conductive plug 5.

Figure 3:
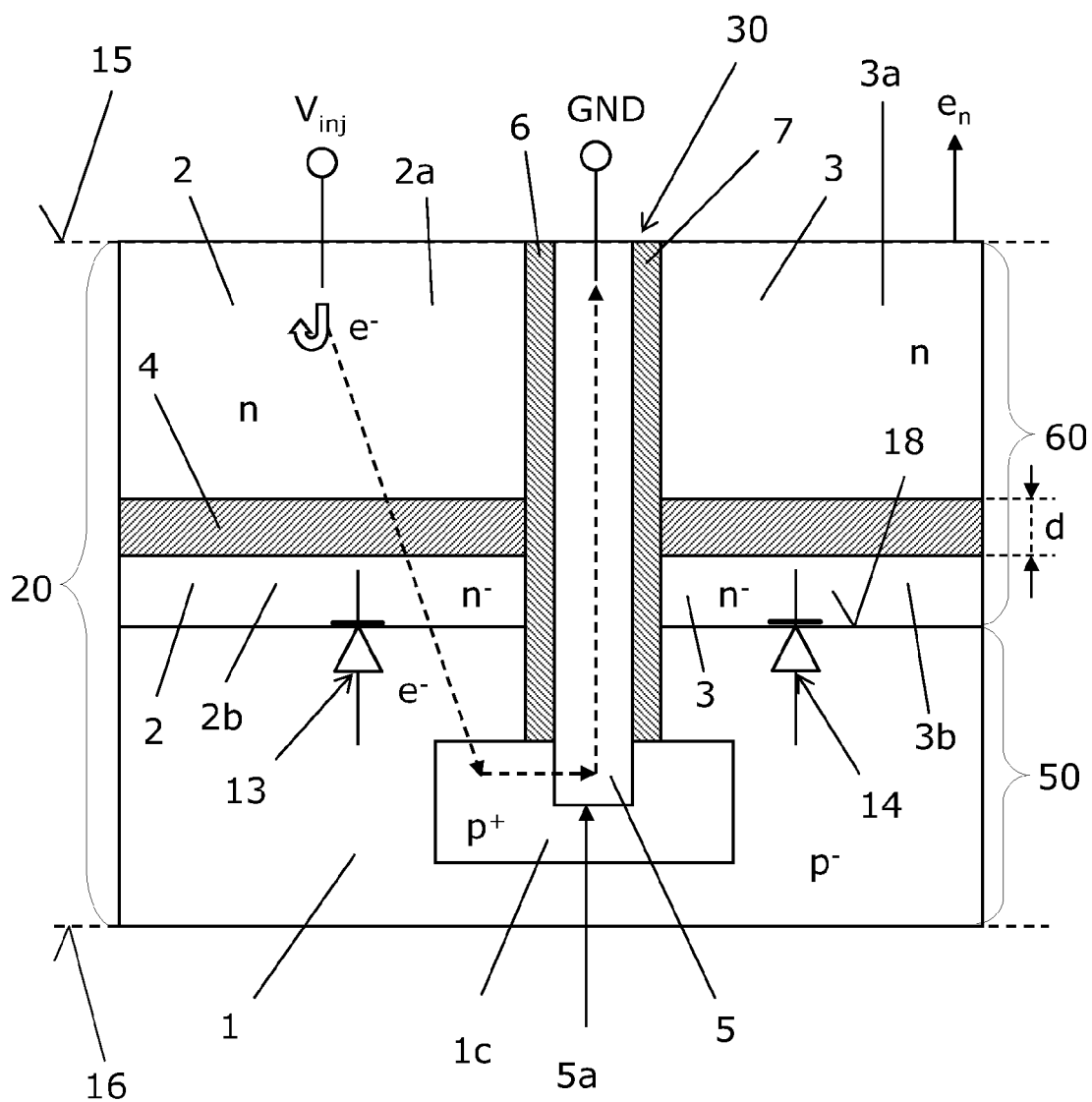
FIG. 3 illustrates a vertical cross-section of a semiconductor device according to one embodiment.

FIG. 3 illustrates one embodiment of a semiconductor device 200 in a section of a vertical cross-section. The semiconductor device 200 of FIG. 3 is also similar to the semiconductor device of FIG. 1. However, the high resistivity region 4 is completely embedded within the first well 2 and second well 3 in the semiconductor device 200. Consequently, the high resistivity region 4 divides the wells 2 and 3 into first portions 2a and 3a, respectively, above the high resistivity region 4 and second portions 2b and 3b, respectively, which are arranged between the interface 18 of the pn-junction and the high resistivity region 4.

In one embodiment, FIG. 3 illustrates a semiconductor device 200 which includes a semiconductor body having a common p-type first semiconductor region 1 or a common substrate 1 and a n-type second semiconductor region formed e.g., by an epitaxial layer 60 thereon. The interface 18 between the common substrate 1 and the second semiconductor region forms a pn-junction. The second semiconductor region accommodates a first n-type well 2 and a second n-type well 3 which form pn-junctions 13 and 14, respectively, with the common substrate 1, and define a main surface 15. A high resistivity layer 4 is spaced from, and arranged between, the main surface 15 and the interface 18, i.e., the high resistivity layer 4 is completely buried within the first well 2 and the second well 3. The wells 2 and 3 are laterally insulated from each other by a deep vertical trench 5a which extends from the main surface 15 through the high resistivity layer 4 into the common substrate 1. In addition, the deep trench 5a includes a conductive plug 5 for connecting the common substrate 1 with a ground potential GND. In the illustrated cross-section, the conductive plug 5 is insulated against the first well 2 and second well 3 by a first insulating region 6 and a second insulating region 7, respectively. Typically, the insulating regions 6 and 7 are made of a dielectric material as has been explained with reference to FIG. 1. For low Ohmic connection, the conductive plug 5 may contact the common substrate 1 via an optional highly doped p-type contact region 1c.

Typically, the semiconductor device 200 is a smart power integrated circuit which, for example, includes a bipolar or a DMOS power transistor in the first well 2 and a logical CMOS circuitry in the second well 3 or vice versa. If an ESD pulse or an energetic electric pulse during operation of the power transistor causes a negative voltage $V_{inj}$, i.e., an electron $e^-$ injection into the first well 2, a part of the charges can be drained off, as indicated by the dashed arrow, by the conductive plug 5 as the high resistivity layer 4 is not completely insulating. There are two reasons for using a not completely insulating high resistivity layer 4 in the device 200 of FIG. 3. It is firstly desirable that the current crosses the high resistivity layer 4 not only capacitatively and secondly, that the portion 2a of the first well 2 is in Ohmic contact with the portion 2b of the first well 2. This ensures, that the potential drop across the high resistivity layer 4 does not exceed the breakdown voltage of the high resistivity layer 4 and facilitates that the diode 13 is switched in forward bias when ESD pulse or an energetic electric pulses is partly to be discharged. Typically, the same applies for the portion 3a and 3b of the second well 3. As indicated by the full arrow, the remaining part of the injected charges is typically reinjected into the device the power transistor is driving. The ratio of reinjected charges depends on the resistance relation which may be tailored by the resistivity and vertical thickness d of the high resistivity layer 4. Therefore, the buried layer 4 is typically formed by a layer of the semiconductor material of the second semiconductor region which includes lattice defects. These lattice defects may be produced by implanting of protons. The vertical dimension d of this layer is typically in a range from 0.2 µm to 2 µm and can be adjusted by the proton energy. The lattice defects are mainly created in the end-of-range of the proton implantation. The vertical dimension d of the buried layer 4 is typically about 10% of the end-of-range depth which can be adjusted by the proton energy. The concentration of lattice defects and hence the conductivity of the high resistivity layer 4 can be adjusted by the proton dose during implantation. A subsequent annealing process is typically used for stabilization of the irradiation-induced lattice defects.

In one embodiment, the semiconductor material of the first well 2 and the second well 3 has an intrinsic conductivity which is at least two orders of magnitude higher than the conductivity of the high resistivity layer 4.

In addition, the high resistivity layer 4 is typically spaced apart from the interface 18 and the adjoining space charge region of the unbiased pn-junction 13 and 14. This is to reduce possible leakage currents.

The semiconductor devices 100 and 200 as explained herein have in common that they include a first semiconductor region 1 of the first conductivity type (p-type), at least a first zone 2 and a second zone 3 of a second conductivity type (n-type) which form respective pn-junctions 13 and 14 with the first semiconductor region 1 and extend to a first surface 15, an insulating structure 30 and a buried high resistivity region 4. The insulating structure 30 extends through the buried high resistivity region 4 and includes a conductive plug 5 which extends from the first surface 15 at least through the buried high resistivity region 4 and contacts the first semiconductor region 1. The conductive plug 5 is insulated from the first zone 2 and the second zone 3. Typically, the conductive plug 5 is, in a cross-section which is orthogonal to the first surface, arranged between a first insulating region 6 and the second insulating region 7. In doing so, the first zone 2 and the second zone 3 are laterally insulated from each other, i.e., in a direction which is perpendicular to the normal direction of the first surface 15 defining the vertical direction. The high resistivity region 4 is typically spaced apart from the pn-junctions 13 and 14, and either completely embedded within the first semiconductor region 1 or within the first zone 2 and second zone 3. The insulating structure 30 and the buried high resistivity region 4 form a protecting structure which protects the devices or complete circuits accommodated in the first well 2 and the second well 3, respectively, against ESD and high energetic pulses injected into one of the two wells 2 and 3. Typically, one of the wells 2 and 3 includes a power semiconductor device such as a power transistor and the other well includes a low-voltage device such as a logical CMOS-structure. More detailed examples of such integrated devices are presented with respect to FIGS. 4 to 7.

Figure 4:
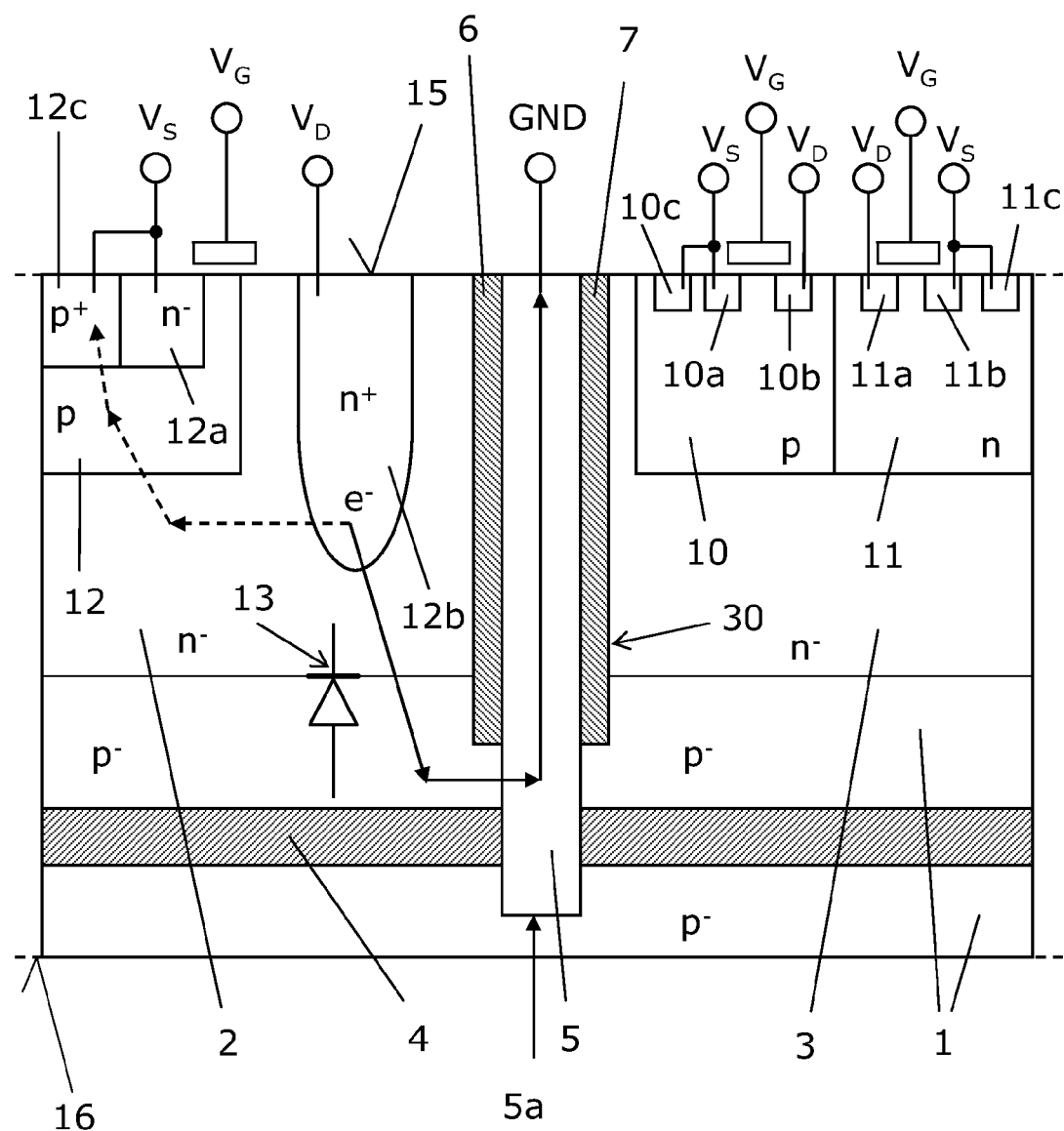
FIG. 4 illustrates a vertical cross-section of a semiconductor device according to one embodiment.

The semiconductor device 100 of FIG. 4 is similar to the semiconductor device 100 of FIG. 1. In the embodiment illustrated in FIG. 4, the first well 2 includes a DMOS power transistor having an n'-type drain region 12b connected to a drain potential $V_D$ and a p-type body region 12. The body region 12 accommodates a n'-type source region 12a and a p$^+$-type contact region 12c which are both connected to the source potential $V_S$. The current between the source region 12a and the drain region 12b is typically controlled by the voltage $V_G$ of a gate electrode. To realize a low resistance Ohmic contact, the doping concentration of the p$^+$-type body contact region 12c is typically higher than the doping concentration of the body region 12. Typical doping concentrations range between about $10^{15}$ cm$^{-3}$ to about $10^{17}$ cm$^{-3}$ for the first (p$^-$) semiconductor region 1, between about $10^{16}$ cm$^{-3}$ to about $10^{19}$ cm$^{-3}$ for the (p$^+$) body contact region 12c, between about $10^{12}$ cm$^{-3}$ to about $10^{15}$ cm$^3$ for the (n) wells 2 and 3, and between about $10^{17}$ cm$^3$ to about $10^{20}$ cm$^{-3}$ for (n$^+$) drain region 12b and the source region 12a, respectively. The second well 3 accommodates an exemplary CMOS-structure which consists of a p-channel and an n-channel MOSFET. The n-channel MOSFET includes a p-type body region 10 into which a n$^+$-type source region 10a, a n$^+$-type drain region 10b and a p$^+$-type contact region 10c are processed. The source region 10a and the contact region 10c are connected to a source potential $V_S$ which typically differs from the source potential $V_S$ of the DMOS power transistor. The drain region 10b is connected to a drain potential $V_D$ which is typically different from the drain potential $V_D$ of the DMOS power transistor. The current between the source region 10a and the drain region 10b is typically controlled by the voltage $V_G$ of a gate electrode. Again, the gate voltage $V_g$ of the n-channel MOSFET is typically different from the gate voltage $V_g$ of the DMOS power transistor. The p-channel MOSFET is similar to the n-channel MOSFET. However, the doping types are reversed. The p$^-$-type source region 11a and the n$^+$-type contact region 11c are connected to the source potential $V_S$ which is typically the same as for the p-channel MOSFET. The p$^+$-type drain region 11c is connected to the drain potential $V_D$ which is typically the same as for the p-channel MOSFET. Furthermore, the current between source region 11a and the drain region 11c is also controlled by the gate voltage $V_G$ of the n-channel MOSFET.

Typically, the DMOS power transistor is connected to an inductive load, e.g., an electromotor. If a high enough negative potential is applied to the drain region 12b during operation, such that the pn-junction 13 and the pn-junction between the first well 2 and the body region 12 are switched in forward mode, the injected electron current e$^-$ is partly drained off via the conductive plug 5 as indicated by the full arrows, and partly reinjected to the motor via the contact region 12c as indicated by the dashed arrow. Consequently, the CMOS-structure in the second well remains unaffected by the current injection and a part of the electric energy can be fed back to the motor. How much of the electric energy is fed back, depends on the resistance relation between both current paths. This may be tailored by the vertical thickness d and or the conductivity of the high resistivity region 4.

Figure 5:
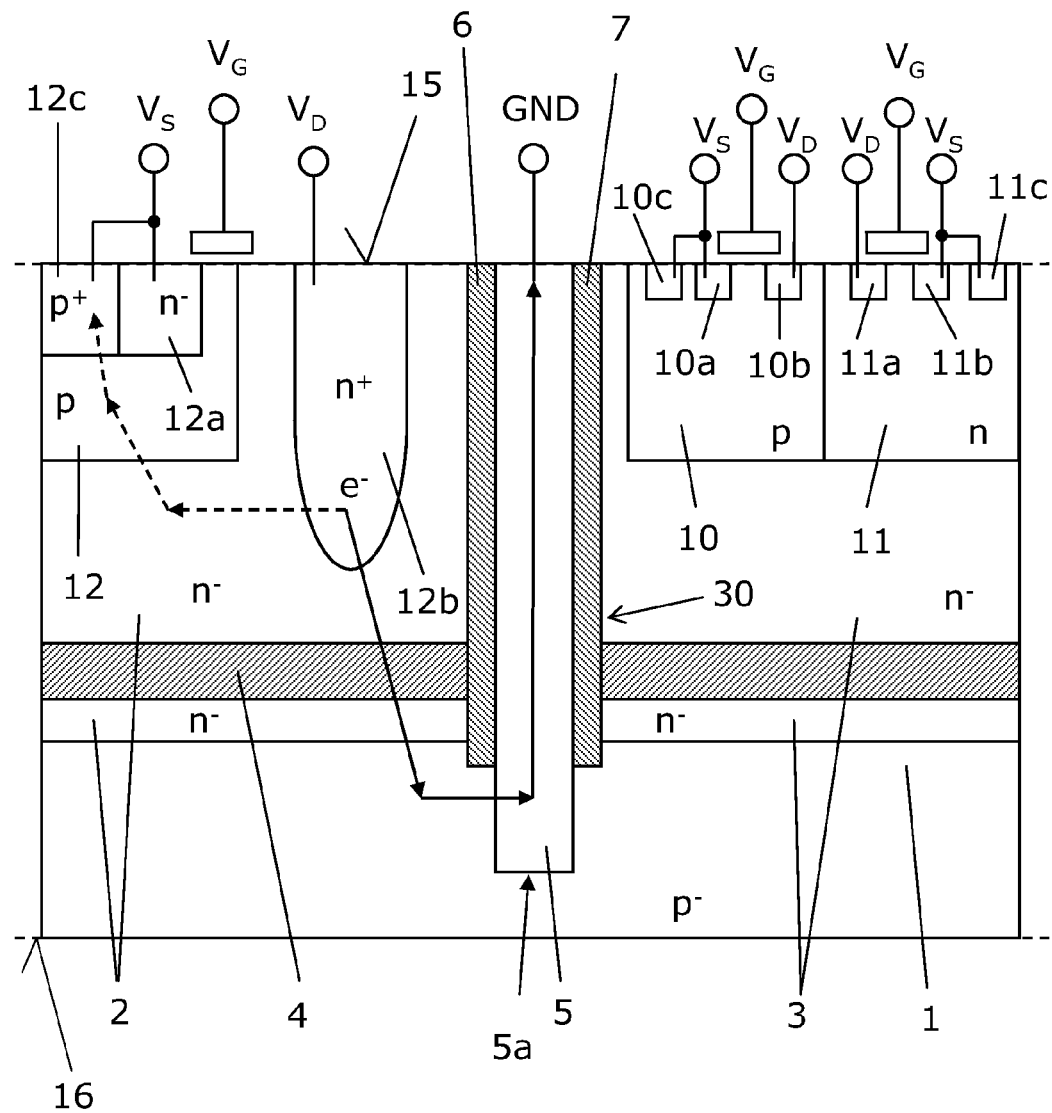
FIG. 5 illustrates a vertical cross-section of a semiconductor device according to one embodiment.

With respect to FIG. 5 one embodiment will be explained. The semiconductor device 200 of FIG. 5 is similar to the semiconductor device of FIG. 4. However, the high resistivity region 4 is completely embedded within the first well 2, which includes a DMOS power transistor, and the second well 3 which accommodates the same CMOS-structure as illustrated in FIG. 4. Again, if a negative voltage is applied to the drain region 12b of the DMOS power transistor, the CMOS structure is protected since the injected electrons can be drained off via the conductive plug 5 and/or reinjected into the driver bridge the DMOS power transistor is typically connected to, e.g., as a high-side DMOS switch. The amount of energy that is fed back may again be tailored by the vertical thickness d and or the conductivity of the high resistivity region 4.

Figure 6:
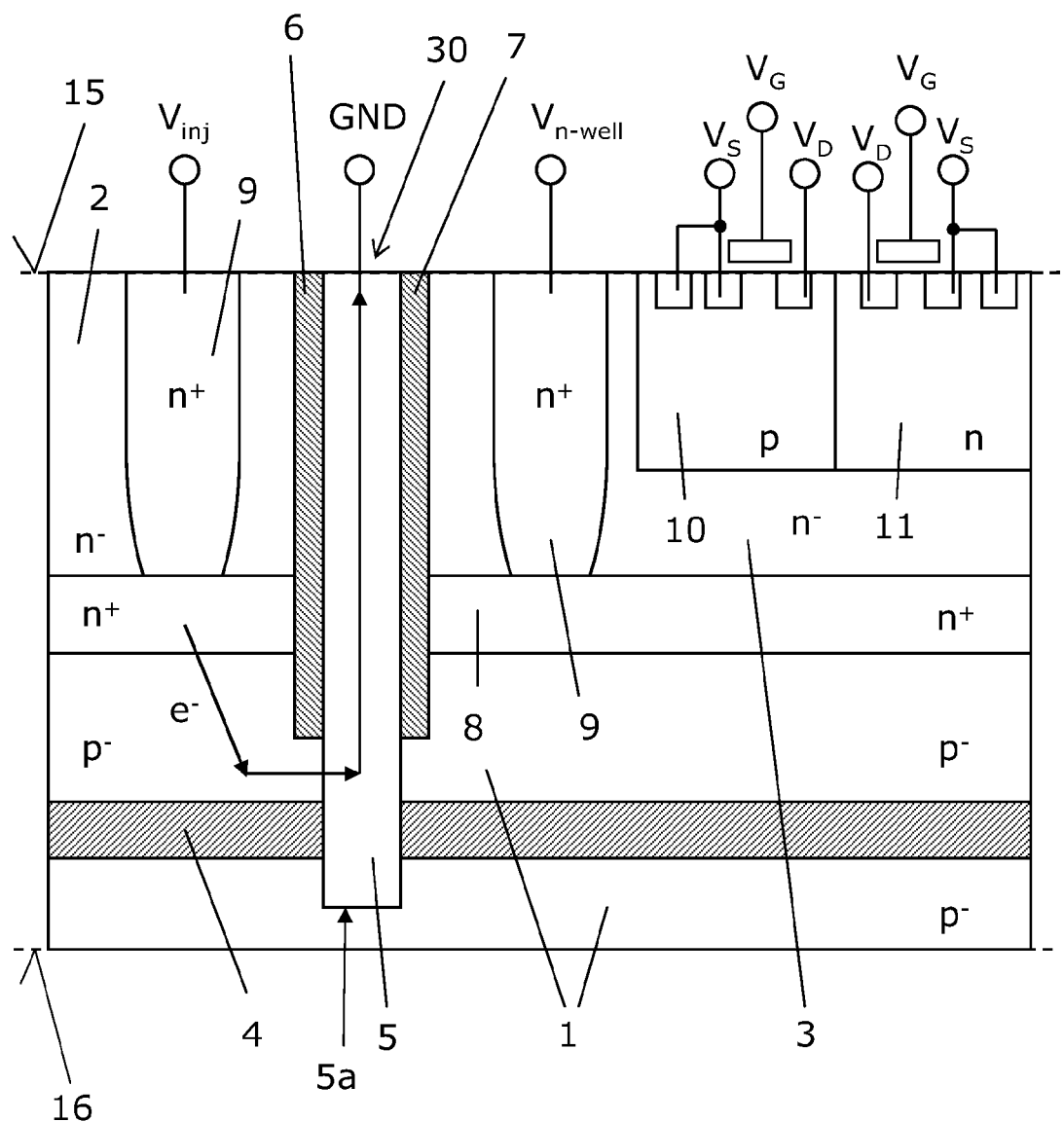
FIG. 6 illustrates a vertical cross-section of a semiconductor device according to one embodiment.

FIG. 6 illustrates one embodiment of a semiconductor device 100 in a section of a vertical cross-section. The semiconductor device 100 of FIG. 6 is similar to the semiconductor device of FIG. 4. However, both the first well 2 and the second well 3 further include a conventional guard structure or guard ring for reducing the cross-talk between different wells. The conventional guard structure includes a highly n-doped buried layer 8, which is arranged between the first surface 15 and the high resistivity region 4, and highly n-doped sinker regions 9 which extends between the first surface 15 and the highly doped buried layer 8. In other words, the second well 3 includes an additional guard structure which is connected to a potential $V_{nwell}$. Typically, $V_{nwell}$ also corresponds to the ground potential. An additional guard structure may e.g., be useful if the circuitry in the second well is particularly susceptible to noise such as a very densely integrated CMOS or a sensitive analog measuring circuit. The sinker region 9 of the first well, which accommodates a not illustrated power semiconductor device, may in addition form a drain region of the power device. It goes without saying that such a guard structure, which is additionally arranged above the buried high resistivity layer 4, may also be used in semiconductor device 200 as illustrated in FIGS. 3 and 5 in which the high resistivity region 4 is completely embedded within the first well 2 and second well 3.

Figure 7:
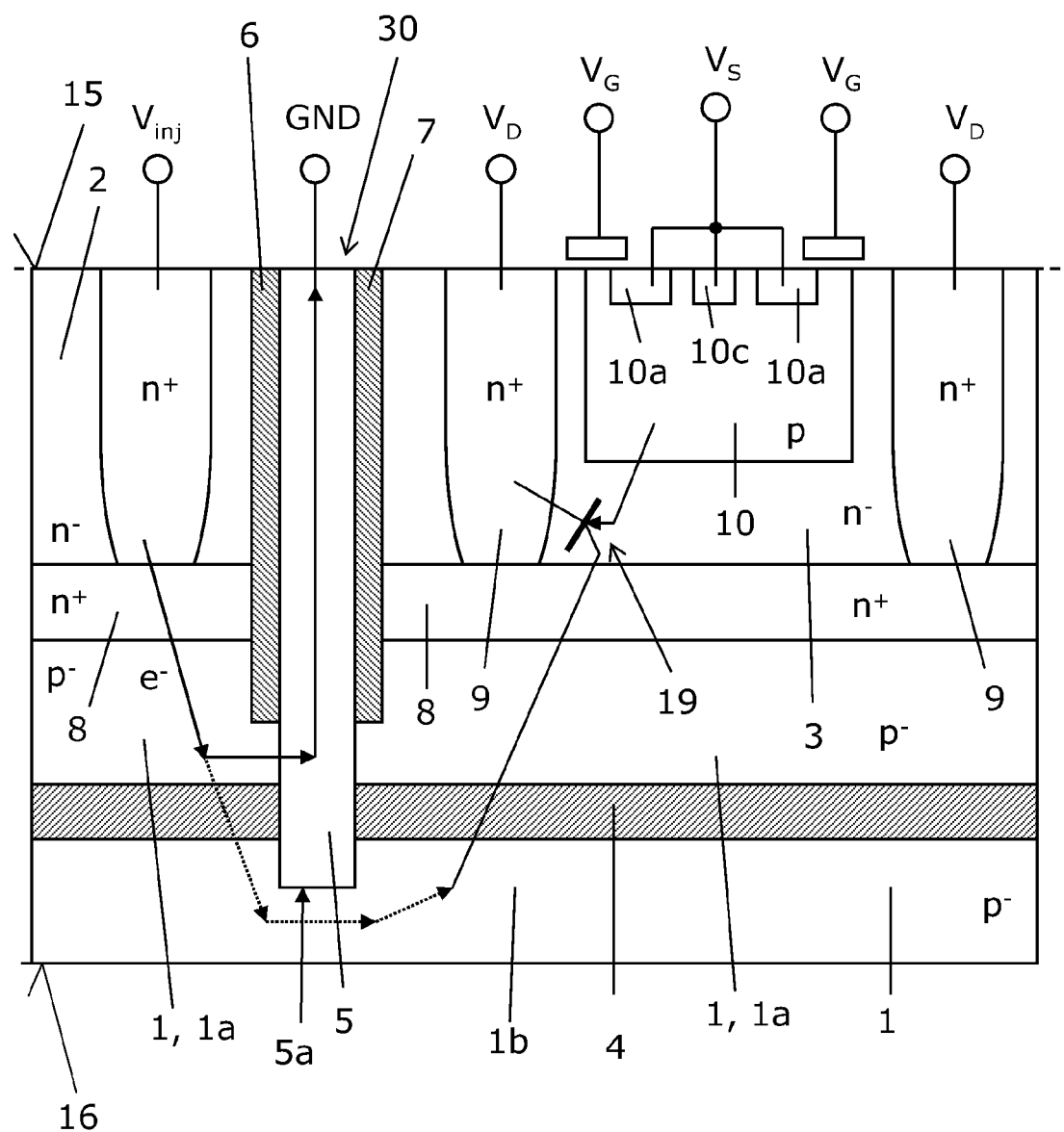
FIG. 7 illustrates a vertical cross-section of a semiconductor device according to one embodiment.
Figure 8:
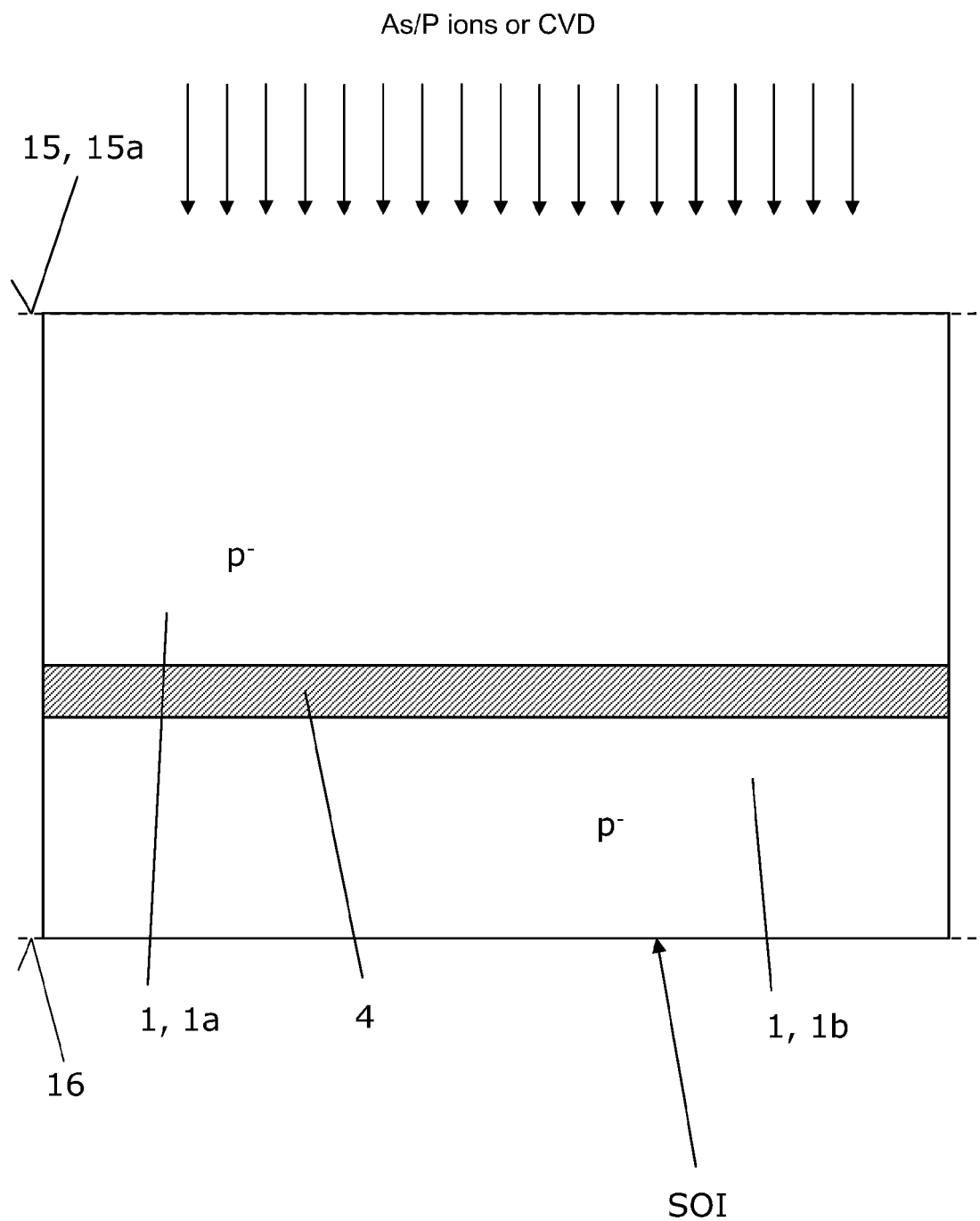
FIGS. 8-12 illustrate manufacturing processes according to one embodiment.

The semiconductor device 100 of FIG. 7 is similar to the semiconductor device 100 of FIG. 6. In the embodiment illustrated in FIG. 7, the second well 3 accommodates, however, instead of a CMOS-structure an exemplary low voltage DMOS transistor forming e.g., part of a measuring circuit. Without the high resistivity region 4, charges which are injected due to a negative voltage $V_{inj}$ from the first well 2, may reach the second portion 1b of the common substrate 1 as indicated by the dashed arrows, and the low voltage DMOS transistor may be disturbed via a parasitic pnp-transistor 19. This is avoided by the high resistivity region 4. In other words, the protecting structure including the insulating structure 30 and the high resistivity region 4 as explained herein provides an efficient protection of the wells 2 and 3 but avoids the parasitic transistors that are typically present in devices with conventional guard structures.

In the following methods for forming the semiconductor devices explained above are described.

Figure 9:
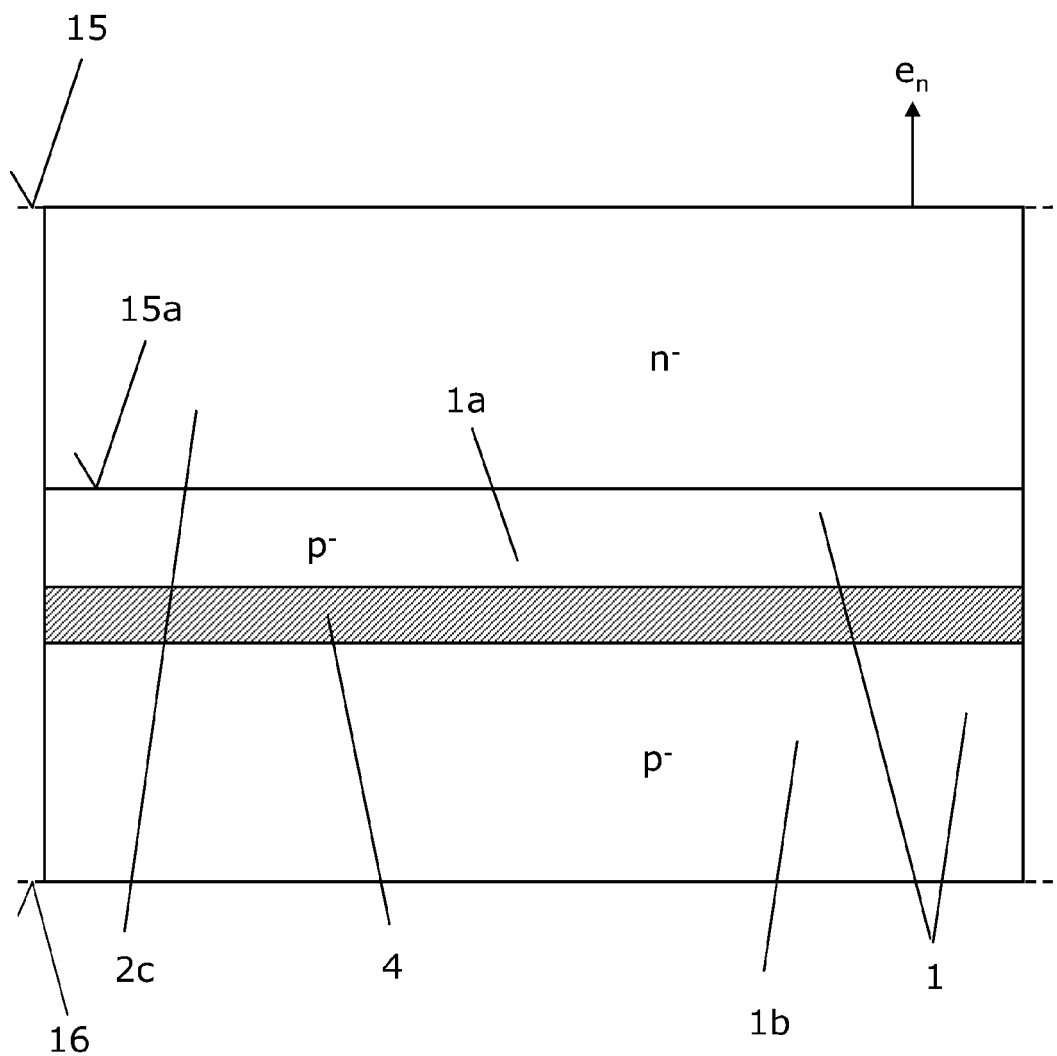

With respect to FIGS. 8 to 12 a first method for forming a semiconductor device 100 according to one or more embodiments is illustrated. In a first process a p-type silicon on insulator (SOI) wafer is provided. The SOI-wafer is illustrated in a section of a cross-section in FIG. 8. The SOI-wafer includes a p-type first semiconductor region 1 and a buried oxide (BOX)-layer forming a high resistivity region or layer 4 which is completely embedded within the first semiconductor region 1. In a second process a n-type second semiconductor region 2c is formed either by implanting of e.g., arsenic (As) or phosphorus (P) or by depositing of a pre-doped semiconductor material using e.g., an epitaxial deposition of silicon or a chemical vapor deposition (CVD) process at the first surface 15 and 15a, respectively, as indicated by the arrows. This is typically followed by a high temperature process. In doing so, a semiconductor device 100 is formed which has a first semiconductor region 1 of the first conductivity type, a second semiconductor region 2c of the second conductivity type forming a pn-junction with the first semiconductor region 1, and a high resistivity region 4 which is buried within the first semiconductor region 1. This is illustrated in FIG. 9.

Figure 10:
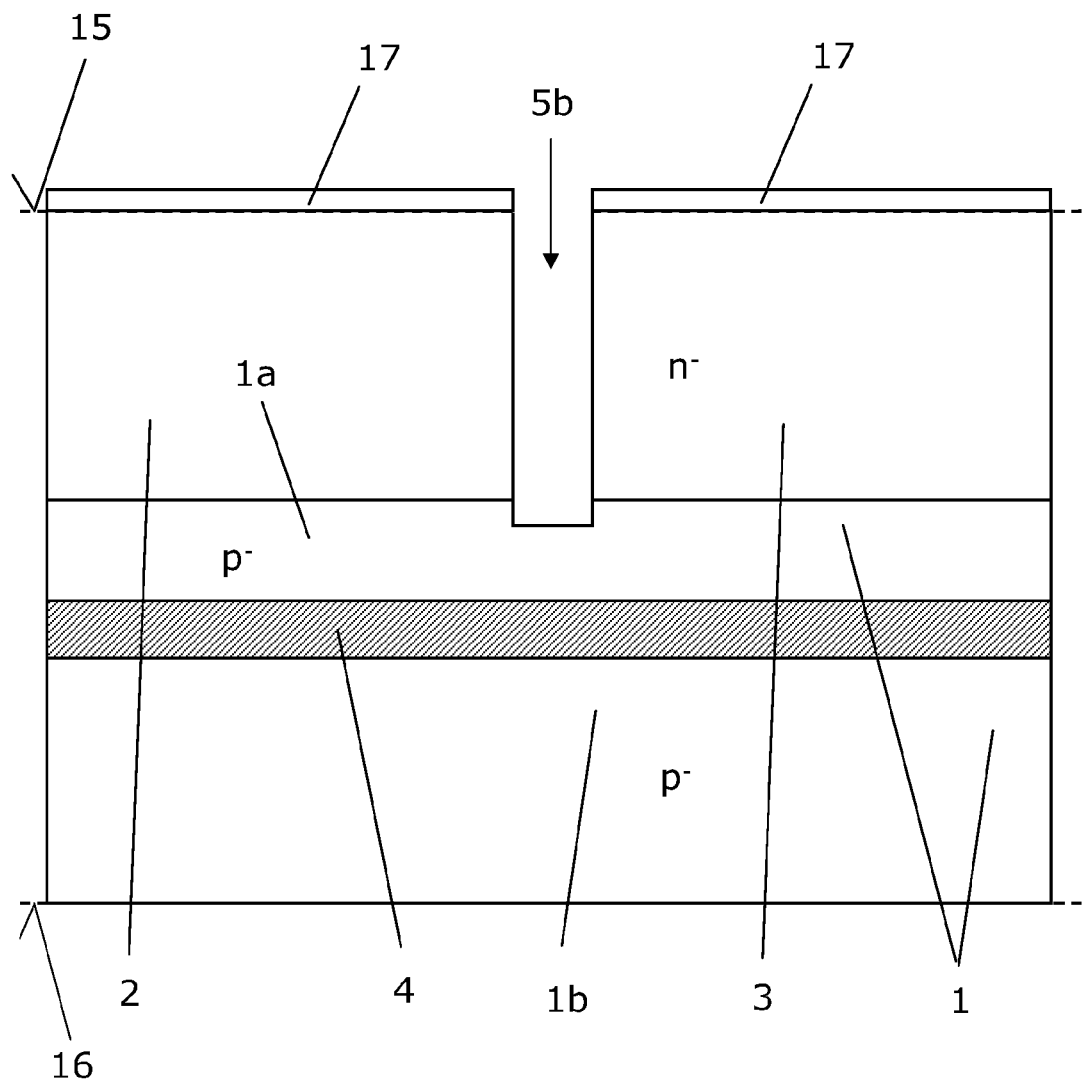

Subsequently, a structured mask 17 is formed on the first surface 15 and a trench 5b is etched through the second semiconductor region 2c into first portion 1a of the first semiconductor region 1 using an anisotropic etching process. The etching typically stops before reaching the buried layer 4. In doing so, a first well or zone 2 and a second well or zone 3 are formed which are separated from each other by the trench 5b. This is illustrated in FIG. 10.

Figure 11:
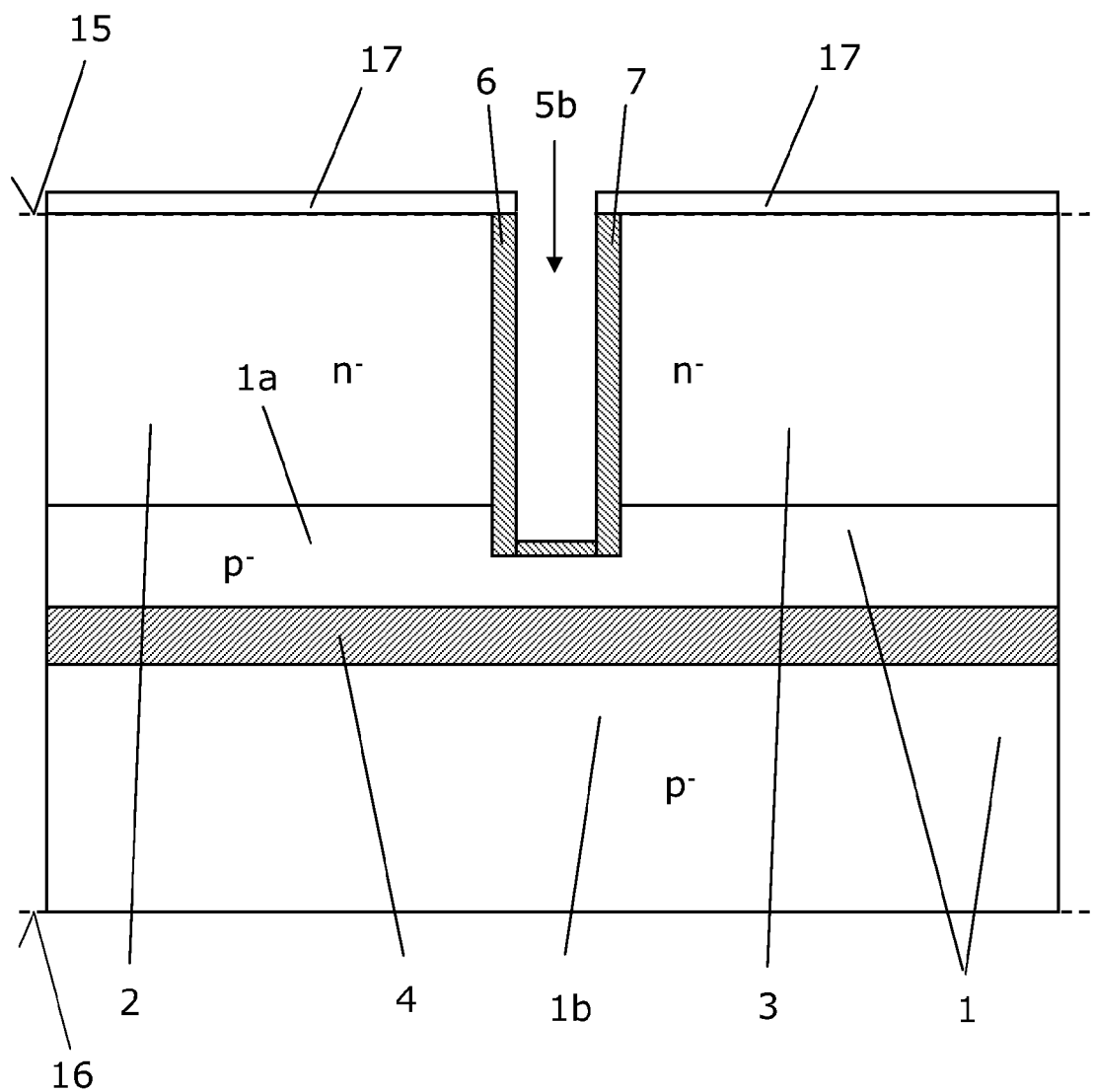

Thereafter, a thermal oxidation process is used to form insulating regions, i.e., dielectric $SiO_2$ layers, 6 and 7 on the side walls in the trench 5b as illustrated in FIG. 11. In one embodiment, the insulating regions or dielectric layers 6 and 7 may be formed by a CVD process.

Thereafter, anisotropic etching processes are carried out to remove the insulating layer on the bottom of the trench 5b and to form a deep trench 5a which also extends through the remaining section of the first portion 1a and the high resistivity region 4 and into the second portion 1b of the first semiconductor region 1. Subsequently, the mask 7 is typically removed and a highly doped poly-Si is deposited to fill the deep trench 5a for forming a conductive plug 5. If needed, the deposited poly-Si is etched back. In one embodiment, the deep trench 5a is filled with a metal, a silicide, carbon or graphite for connecting the first portion 1a and the second portion 1b of the first semiconductor region 1.

Figure 12:
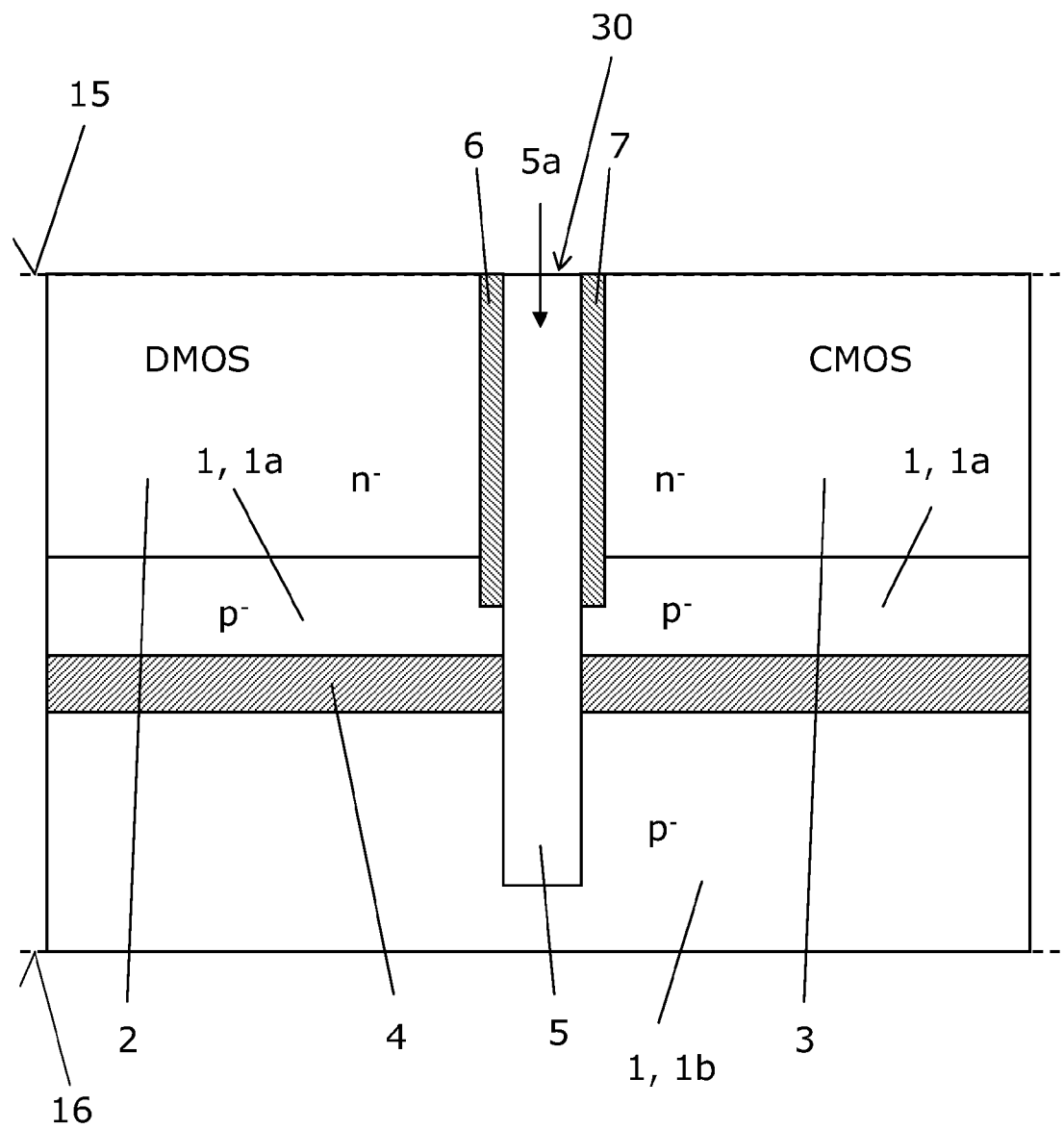

A DMOS-power device is formed in the first well 2 and a CMOS structure is formed in the second well 3 using standard techniques. The resulting integrated semiconductor device 100 is illustrated in FIG. 12. Typically, the integrated semiconductor device 100 of FIG. 12 is a smart power integrated circuit. Depending on the application of the smart power integrated circuit, several power semiconductor devices such as power transistors or thyristors and several low voltage logical and/or measuring circuits may be integrated on a single chip.

In addition, a highly n-doped buried layer 8 and highly n-doped sinker region 9 of the second conductivity type may be formed in the first well 2 and/or the second well 3, i.e., in the second semiconductor region by implantation of dopants. The highly n-doped buried layer 8 may be formed prior to forming the trench 5b as a continuous layer without a mask.

Furthermore, highly doped p-type contact regions 1c and 1d may additionally be formed by implantation of dopants, e.g., after forming the trench 5b, within the first semiconductor region 1 to provide a better Ohmic contact with the conductive plug 5.

Figure 13:
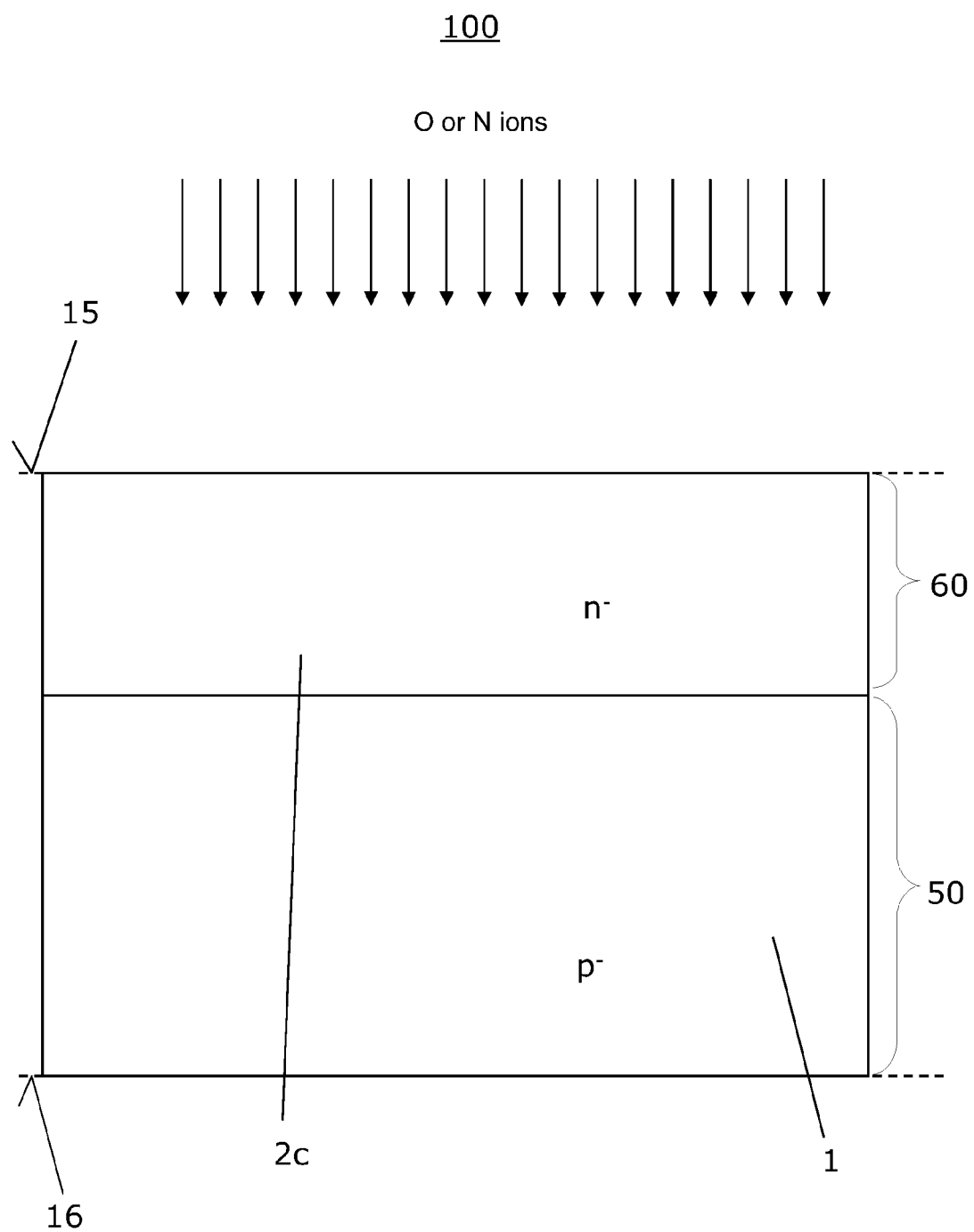
FIGS. 13-16 illustrate manufacturing processes according to one or more embodiments.

With respect to FIGS. 13 to 16 another method for forming a semiconductor device 100 according to several embodiments is illustrated in a cross-sectional view. In a first process, a semiconductor body is provided which already includes a p-type first semiconductor region 1 and a n-type second semiconductor region 2c formed e.g., as a thin layer 60 on the first semiconductor region 1. This is illustrated in FIG. 13. In a second process, oxygen (O) and or nitrogen (N) are implanted from the first surface 15 in a stoichiometric concentration for forming a buried high resistivity layer 4 within the first semiconductor region 1. In doing so, a first portion 1a and a second portion 1b which are separated from each other by the buried high resistivity layer 4 are formed. The resulting semiconductor device 100 is similar to the device 100 illustrated in FIG. 9.

In one embodiment, the semiconductor device 100 is formed by providing, in a first process, a p-type semiconductor wafer or substrate 1 having a main surface. In a second process, oxygen and or nitrogen are implanted from the main surface in a stoichiometric concentration for forming a buried high resistivity layer 4 between a first portion 1a and a second portion 1b of the semiconductor substrate 1. In a third process, an n-type second semiconductor region 2c is formed on the main surface e.g., by depositing of predoped silicon.

Figure 14:
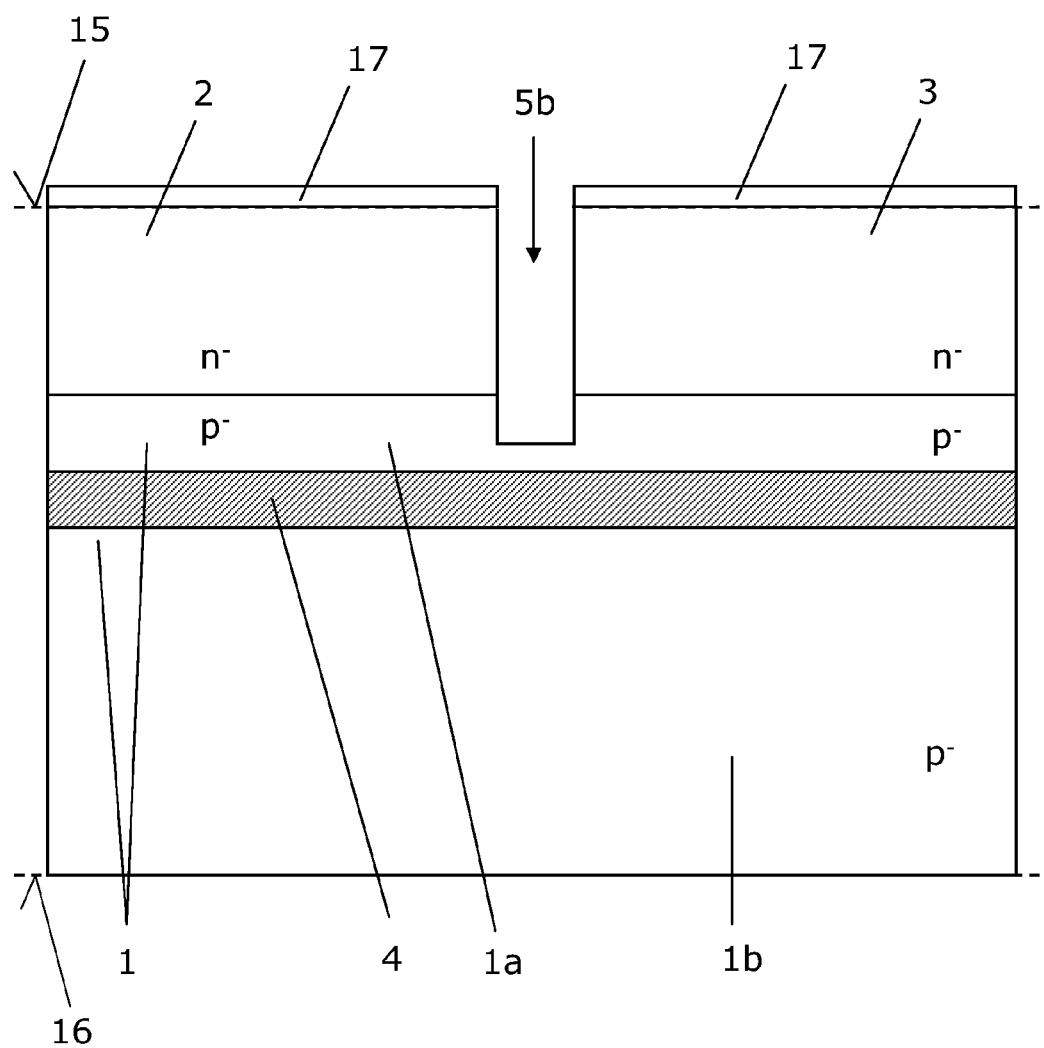

Subsequently, a vertical trench 5b is formed using a mask 7 and an anisotropic etching process. The resulting semiconductor structure 100 having a trench 5b which extends from the first surface 15, through the second semiconductor region 2c into the first portion 1a without reaching as far as the buried high resistivity layer 4 of the first semiconductor region 1 is illustrated in FIG. 14. Accordingly, a first well 2 and a second well 3 are formed.

Figure 15:
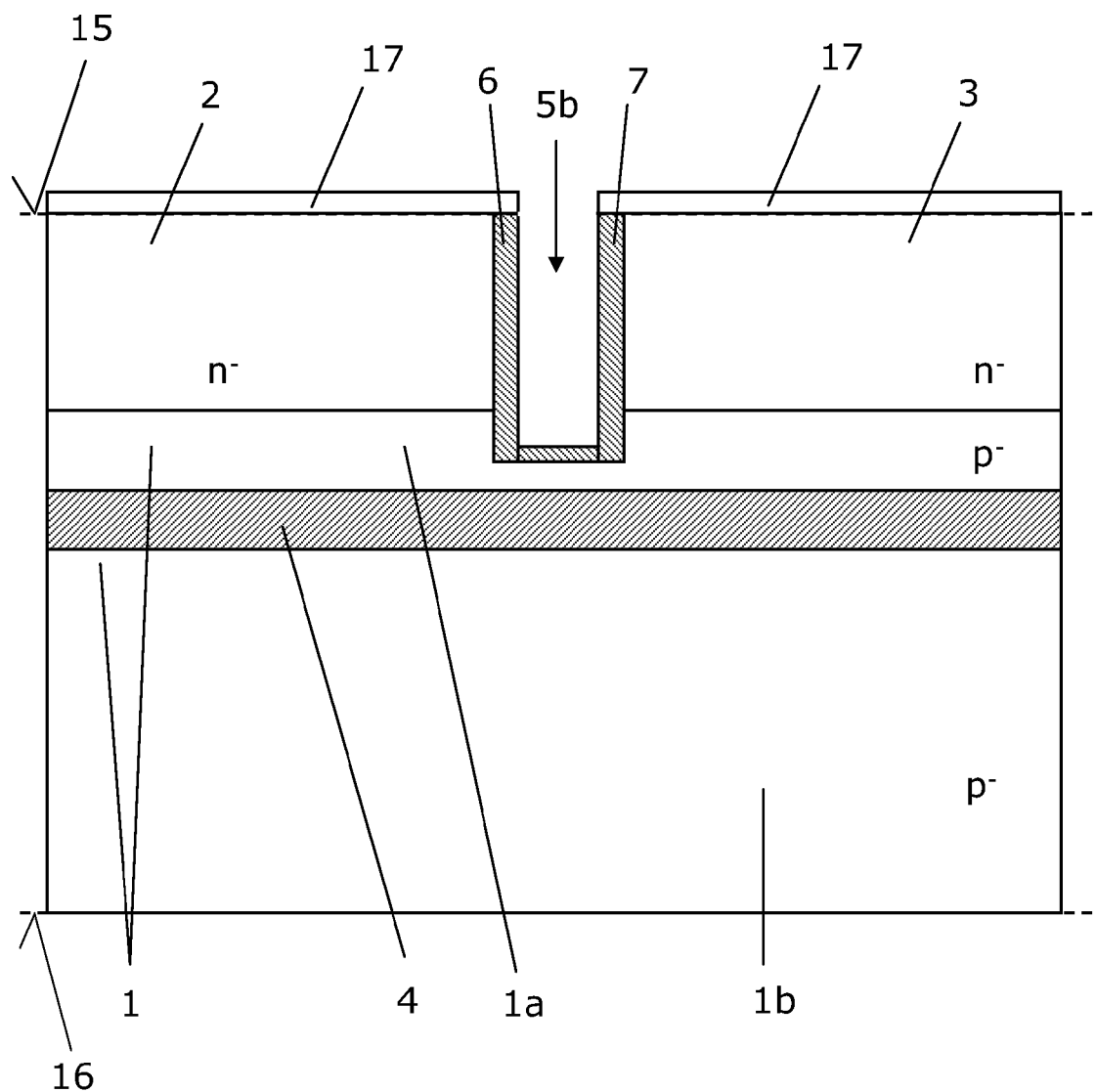

Thereafter, insulating regions or dielectric layers 6 and 7 are formed on the walls of the trench 5b as has been explained with reference to FIG. 11. The resulting semiconductor structure 100 is illustrated in FIG. 15.

Subsequently, anisotropic etching processes are carried out to remove the insulating layer on the bottom of the trench 5b and to form a deep vertical trench 5a which extends through the buried high resistivity layer 4 into the second portion 1b of the first semiconductor region 1. As has been explained with respect to FIG. 12, the mask 17 is typically removed thereafter and the deep trench 5a is filled with a conductive material to contact the first and second portion 1a and 1b of the first semiconductor region 1.

Figure 16:
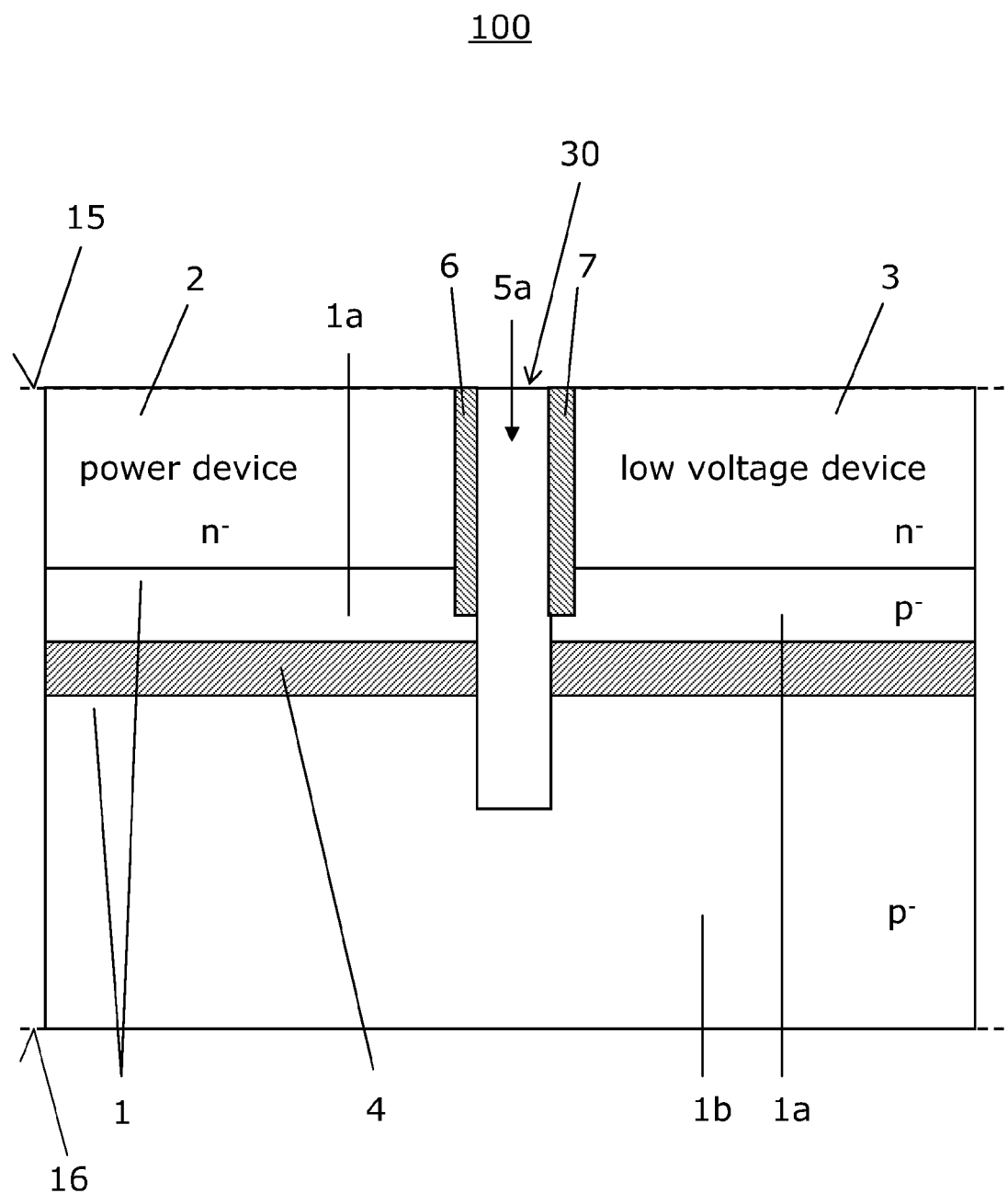

Finally a power semiconductor device is formed in the first well 2 and a low voltage device is formed in the second well 3 as illustrated in FIG. 16. The first semiconductor region 1 typically forms a common substrate 1, which is connected to ground by the conductive plug 5, for the two wells 2 and 3.

Figure 17:
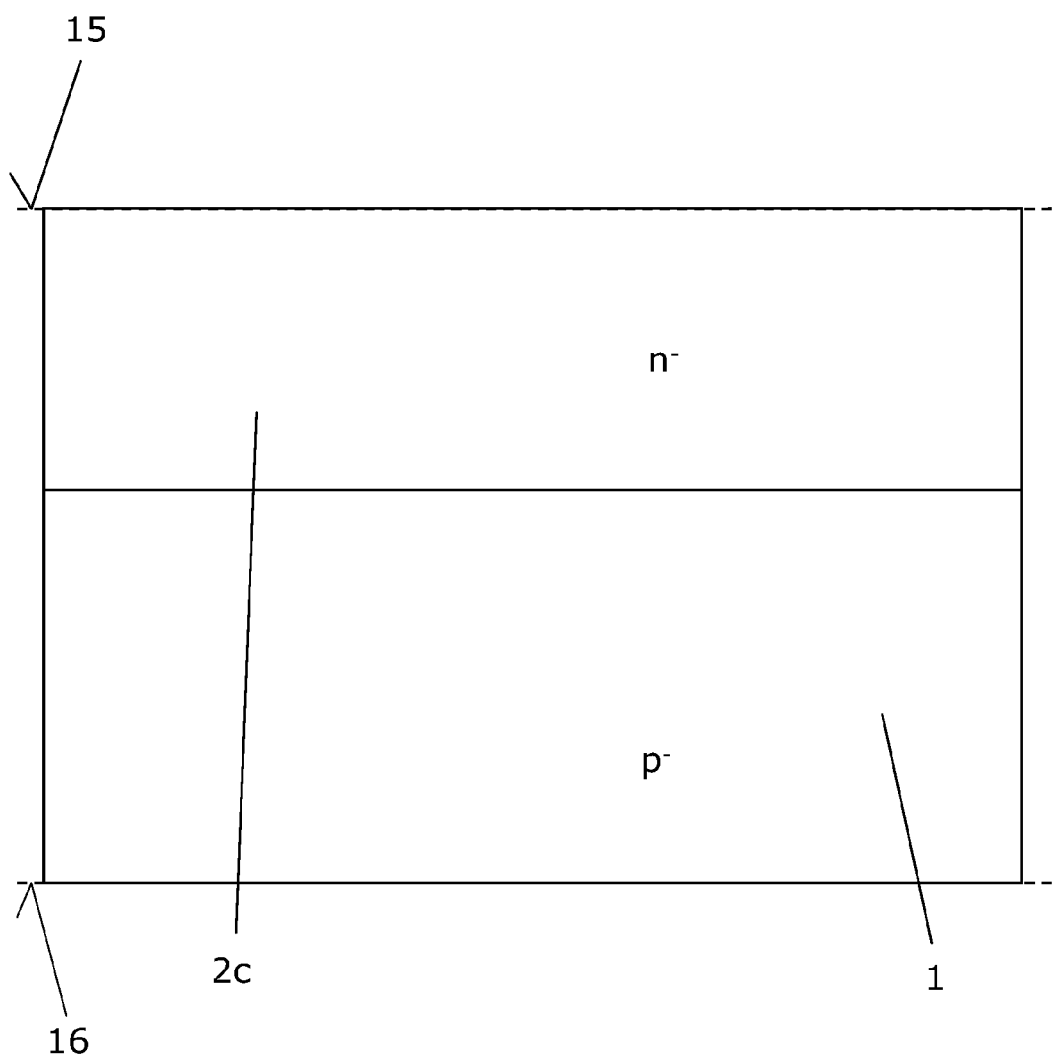
FIGS. 17-22 illustrate manufacturing processes according to one or more embodiments.

With respect to FIGS. 17 to 21 a method for forming a semiconductor device 100 or 200 according to several embodiments is illustrated in a cross-sectional view. In a first process, a semiconductor body is provided which includes a p-type first semiconductor region 1 and an n-type second semiconductor region 2c formed on the first semiconductor region 1. This is illustrated in FIG. 17.

Figure 18:
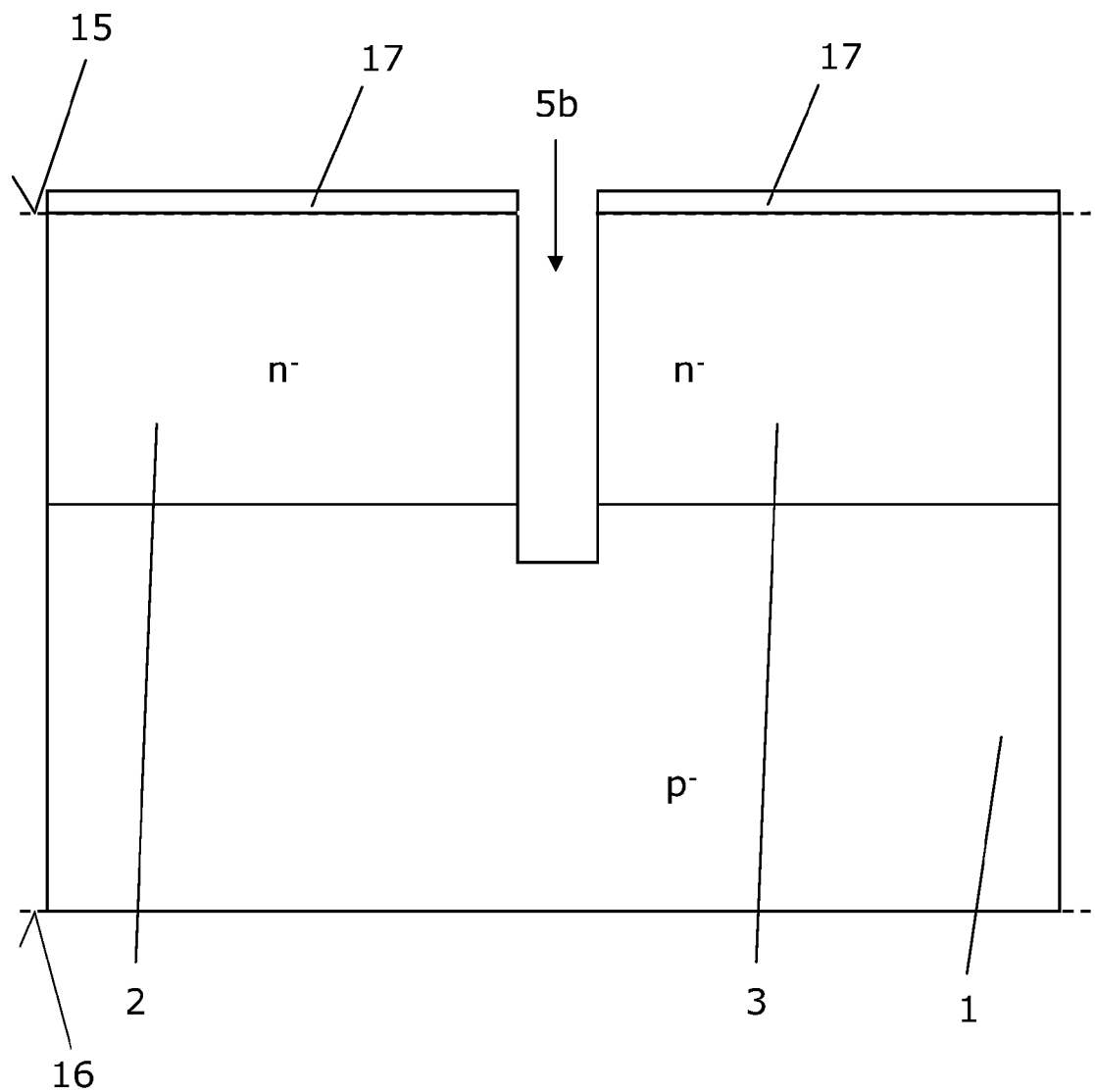

In a second process a vertical trench 5b is formed by anisotropic etching through a structured mask 17 such that the trench 5b extends into the first semiconductor region 1 as illustrated in FIG. 18.

Figure 19:
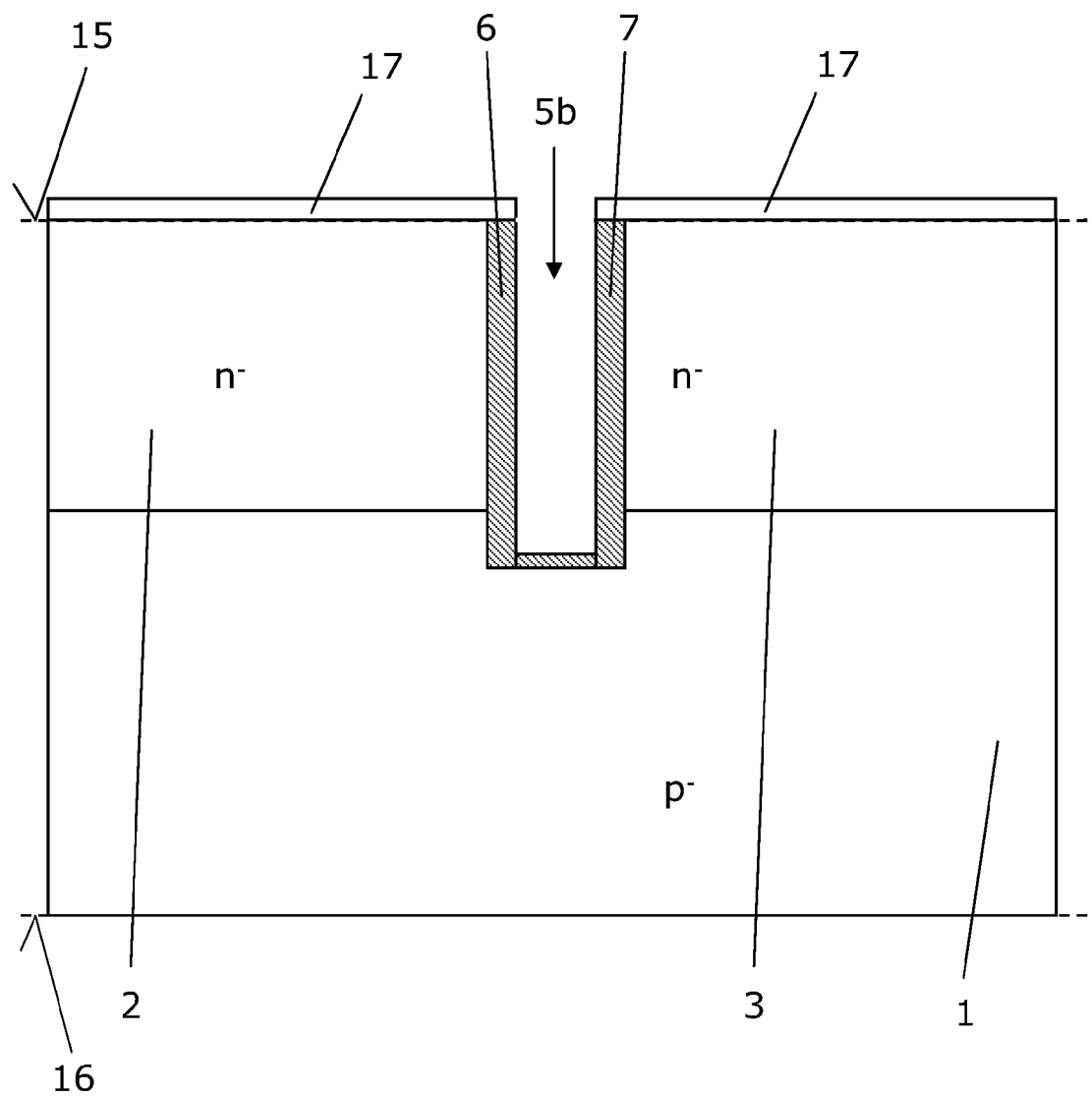

Thereafter, insulating regions or dielectric layers 6 and 7 are formed on the walls of the trench 5b as has been explained with reference to FIG. 11. The resulting semiconductor structure 200 is illustrated in FIG. 19.

Subsequently, anisotropic etching processes are performed to remove the insulating layer on the bottom of the trench 5b and to form a deep vertical trench 5a. As has been explained with respect to FIG. 12, the mask 17 is removed thereafter and the deep trench 5a is filled with a conductive material to contact the first semiconductor region 1. The mask 17 may, however, also be removed after filling the deep trench 5a with the conductive material.

Figure 20:
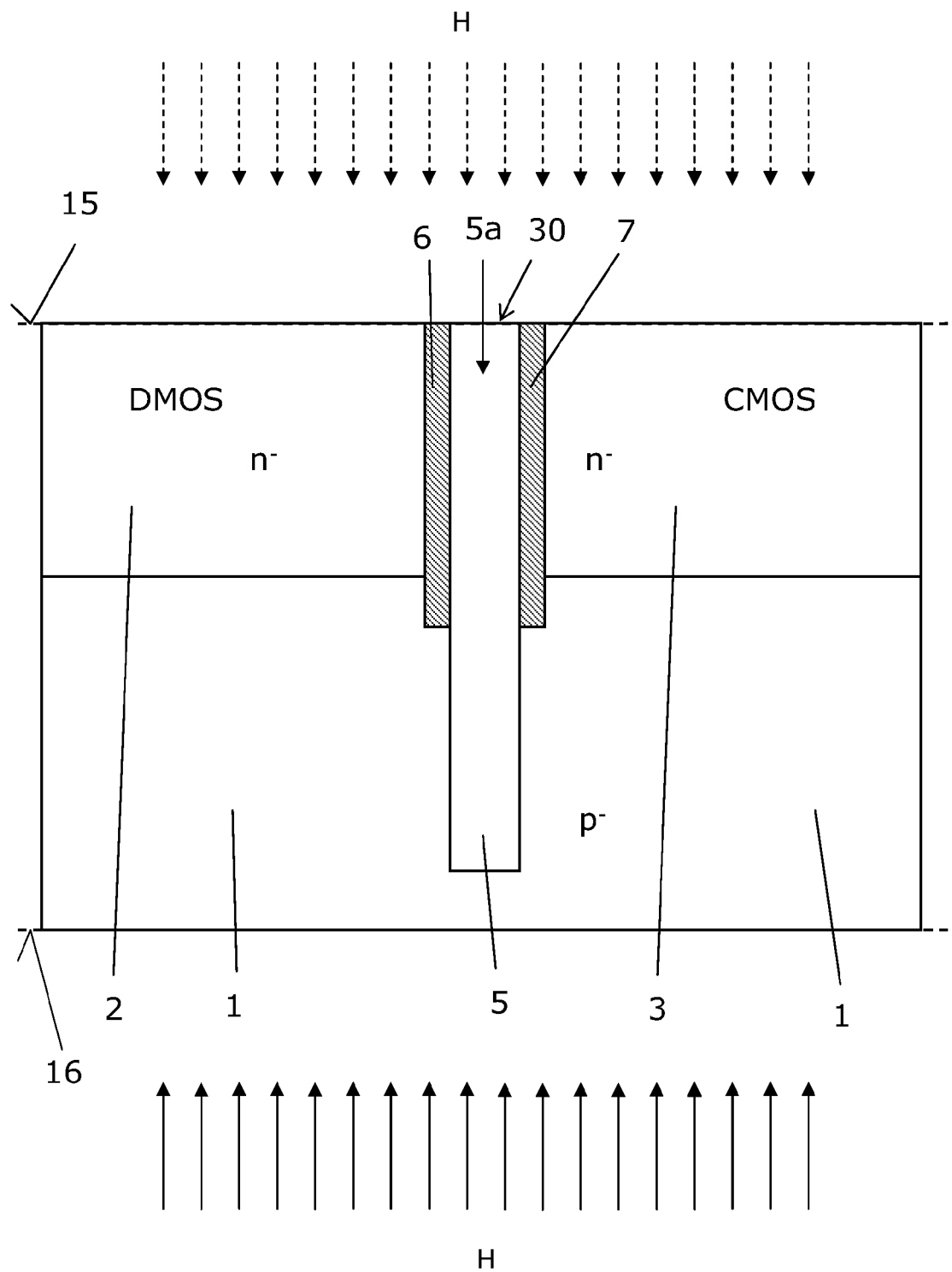

Subsequently, a power semiconductor device such as a DMOS-transistor or HV-MOS device is formed in the first well 2 and a low voltage device such as a CMOS logical device is formed in the second well 3. The resulting structure is illustrated in FIG. 20.

Figure 21:
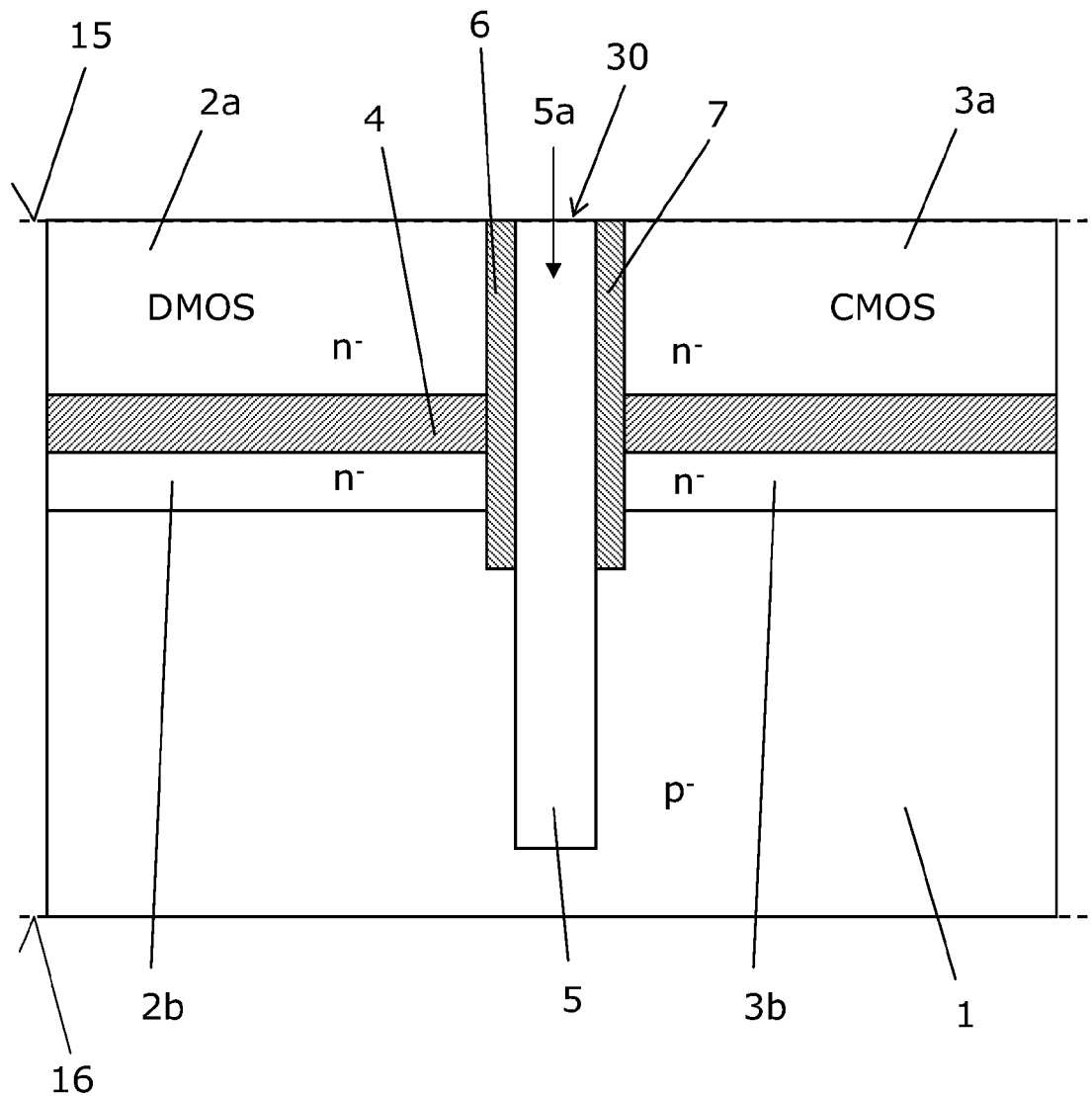

Thereafter, protons (H) are implanted from the second surface 16 which is opposite to the first surface 15, or in one embodiment from the first surface 15 into the first well 2 and second well 3 to form a buried high resistivity layer 4 of lattice defects therein. The resulting semiconductor device 200 is illustrated in FIG. 21. Typically, the proton energy is in a range of about 2 MeV to about 15 MeV for irradiation from the second surface 16, whereas the required proton energy depends on the thickness of the wafer. For irradiation from the first surface 15, the proton energy typically ranges from about 300 keV to about 2 MeV. In one or more embodiments, the proton dose ranges from about $10^{12}$ cm$^{-2}$ to about $10^{14}$ cm$^{-2}$. Typically, the irradiation process is followed by a tempering process in a temperature range from about 180° C. to about 250° C., more typically in a range from about 200° C. to about 230° C., which typically lasts one hour up to several hours. If required, a back metallization is finally formed on the second surface 16.

Figure 22:
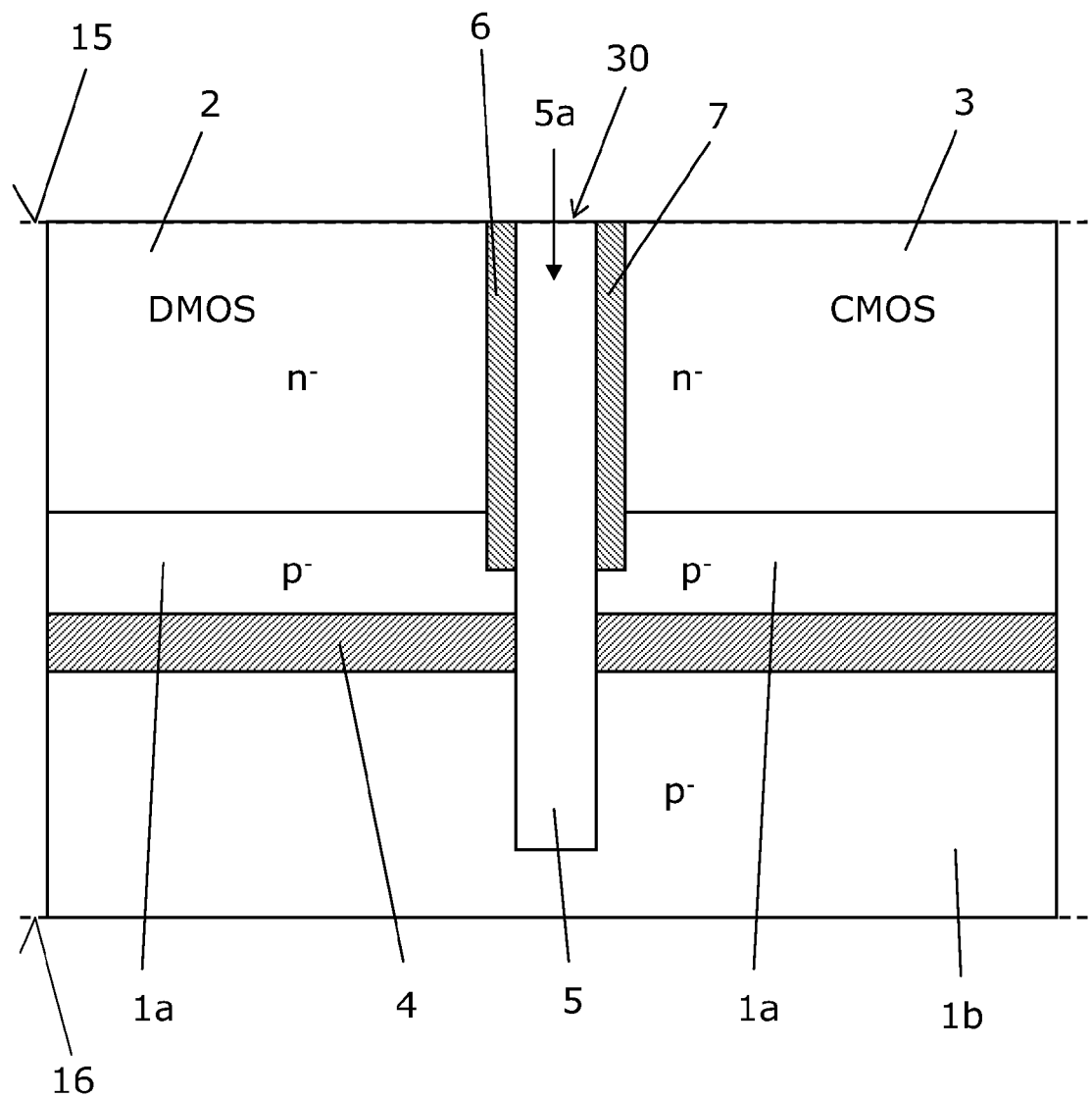

Protons can also be implanted from the second surface 16, or in one embodiment from the first surface 15, into the first semiconductor region 1 to form a buried high resistivity layer 4 of lattice defects therein. The resulting semiconductor device 100 is illustrated in FIG. 22.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first semiconductor region of a first conductivity type;
at least a first and a second zone of a second conductivity type forming respective pn-junctions with the first semiconductor region;
a buried high resistivity region; and
at least an insulating structure insulating the first zone from the second zone, the insulating structure comprising a conductive plug extending through the buried high resistivity region and being in Ohmic contact with the first semiconductor region.

2. The semiconductor device of claim 1, wherein the semiconductor device further comprises a first surface to which the first and second zone extend to, the first surface comprising a normal direction defining a vertical direction, and wherein the high resistivity region is formed by a layer which is substantially parallel to the first surface.

3. The semiconductor device of claim 2, wherein the insulating structure comprises, in a vertical cross-section, a first and a second insulating region, and wherein the conductive plug is arranged between the first and the second insulating region.

4. The semiconductor device of claim 2, wherein the high resistivity region comprises a vertical thickness which is lower than about 10 nm.

5. The semiconductor device of claim 1, comprising wherein the high resistivity region is buried within one of the first semiconductor region, and the first and second zone.

6. The semiconductor device of claim 1, wherein the high resistivity region comprises a heat transfer coefficient which is larger than about 108 W/(K*m$^2$).

7. The semiconductor device of claim 1, wherein the high resistivity region comprises a dielectric material.

8. The semiconductor device of claim 1, wherein the semiconductor device comprises a silicon on insulator substrate and wherein the high resistivity region is a buried oxide layer of the silicon on insulator substrate.

9. The semiconductor device of claim 1, wherein the first zone, the second zone and the first semiconductor region comprise a semiconductor material comprising an intrinsic conductivity; and wherein the high resistivity region comprises a semiconductor material comprising lattice defects such that the conductivity of the high resistivity layer is at least two orders of magnitude lower than the intrinsic conductivity.

10. The semiconductor device of claim 1, further comprising:
at least a contact region of the first conductivity type embedded in the first semiconductor region and contacts the conductive plug,
wherein the first semiconductor region comprises a first doping concentration, and
wherein the contact region comprises a doping concentration higher than the first doping concentration.

11. The semiconductor device of claim 2, wherein at least one of the first and second zone further comprises a highly doped buried layer arranged between the first surface and the high resistivity region.

12. The semiconductor device of claim 11, wherein at least one of the first and second zone further comprises a highly doped sinker region extending from the first surface to the highly doped buried layer.

13. The semiconductor device of claim 1, wherein the first zone comprises an analog circuitry and wherein the second zone comprises a digital circuitry.

14. A smart power integrated circuit including a semiconductor body, comprising:
- a first semiconductor region of a first conductivity type;
- a first and a second well of a second conductivity type forming respective pn-junctions with the first semiconductor region, and defining a main surface;
- a high resistivity layer spaced from the main surface and being buried within the first and the second well; and
- a vertical trench insulating the first well from the second well and extending from the main surface through the high resistivity layer into the first semiconductor region, the vertical trench comprising a conductive plug for connecting the first semiconductor region, the conductive plug being insulated from the first and second well.

15. The semiconductor device of claim 14, wherein the first and second well comprise a semiconductor material comprising an intrinsic conductivity and wherein the high resistivity layer comprises a second conductivity which is at least two orders of magnitude lower than the first conductivity.

16. A smart power integrated circuit comprising a semiconductor body, comprising:
- a first semiconductor region of a first conductivity type;
- a first and a second well of a second conductivity type defining a main surface;
- a high resistivity layer extending essentially parallel to the main surface and being buried within the first semiconductor region, the first semiconductor region comprising a first portion arranged above the high resistivity layer and a second portion arranged below the high resistivity layer, the first portion forming respective pn-junctions with the first and the second well; and
- a vertical trench insulating the first and the second well from one another, and extending from the main surface through the high resistivity region into the second portion of the first semiconductor region, the trench comprising a conductive plug for electrically connecting the first portion and the second portion of the first semiconductor region, the conductive plug being insulated from the first and second well.

17. The semiconductor device of claim 16, wherein the first semiconductor region comprises a first resistivity and wherein the high resistivity layer comprises a second resistivity which is at least two orders of magnitude higher than the first resistivity.

* * * * *